() United States Patent  
Yamada

(10) Patent No.: US 7,720,273 B2  
(45) Date of Patent: May 18, 2010

(54) FIXED PATTERN EXTRACTING APPARATUS, PATTERN WRITING APPARATUS, FIXED PATTERN EXTRACTING METHOD AND RECORDING MEDIUM

(75) Inventor: Ryo Yamada, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 834 days.

(21) Appl. No.: 11/278,594

(22) Filed: Apr. 4, 2006

(65) Prior Publication Data

US 2006/0245633 A1    Nov. 2, 2006

(30) Foreign Application Priority Data

Apr. 19, 2005    (JP) .............................. 2005-120823

(51) Int. Cl.
 G06K 9/00    (2006.01)
 G06F 17/50    (2006.01)
(52) U.S. Cl. ........................ 382/141; 382/144; 382/145; 382/147; 716/19; 716/21
(58) Field of Classification Search ............. 716/18–21; 382/141, 144, 145, 147
 See application file for complete search history.

(56) References Cited

U.S. PATENT DOCUMENTS 5,590,048 A * 12/1996 Abe et al. ..................... 716/19

6,047,116 A * 4/2000 Murakami et al. ............ 716/19
6,883,160 B2 * 4/2005 Tsuchiya et al. .............. 716/21
2003/0061594 A1 * 3/2003 Tsuchiya et al. .............. 716/19
2004/0229472 A1 * 11/2004 Kobayashi ................... 438/736

FOREIGN PATENT DOCUMENTS

JP    3266327    1/2002

* cited by examiner

Primary Examiner—Paul Dinh  
Assistant Examiner—Patrick Sandoval  
(74) Attorney, Agent, or Firm—McDermott Will & Emery LLP

(57) ABSTRACT

In a computer, fixed pattern information indicating respective shapes of fixed pattern elements included in a fixed pattern and respective position vectors of the fixed pattern elements with respect to a reference position in the fixed pattern is prepared and key pattern elements coincident with any of fixed pattern elements are specified from writing pattern elements. Subsequently, a value is added to a position designated by a reverse vector of position vector of a corresponding fixed pattern element with each of the key pattern elements as a starting point in a setting area which corresponds to a writing pattern, and a position is specified to which a value coincident with the number of fixed pattern elements is given, to detect an existing position of the fixed pattern in the writing pattern. It is thereby possible in the computer to extract a fixed pattern from a writing pattern at high speed.

13 Claims, 20 Drawing Sheets

F I G. 13
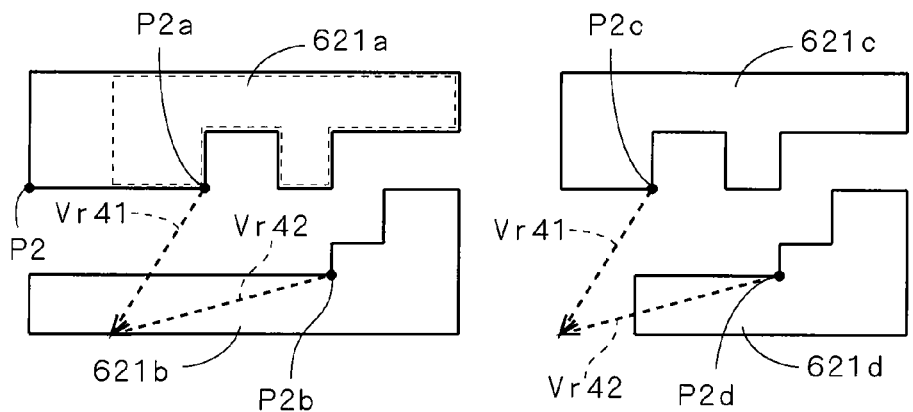
F I G. 14
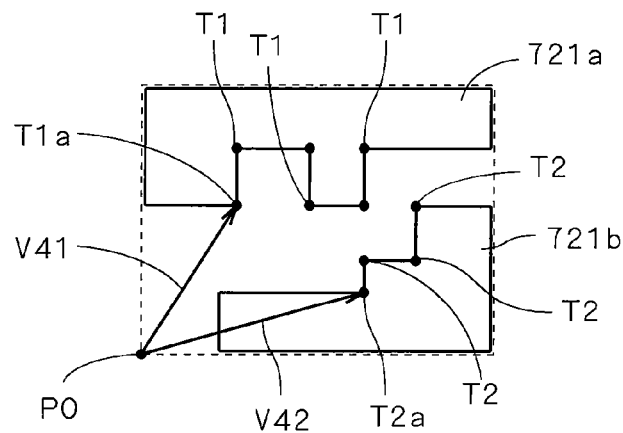
F I G. 15
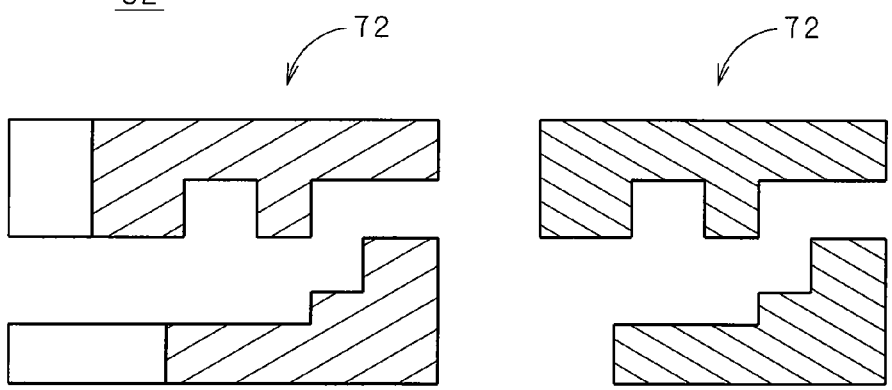

F I G. 16
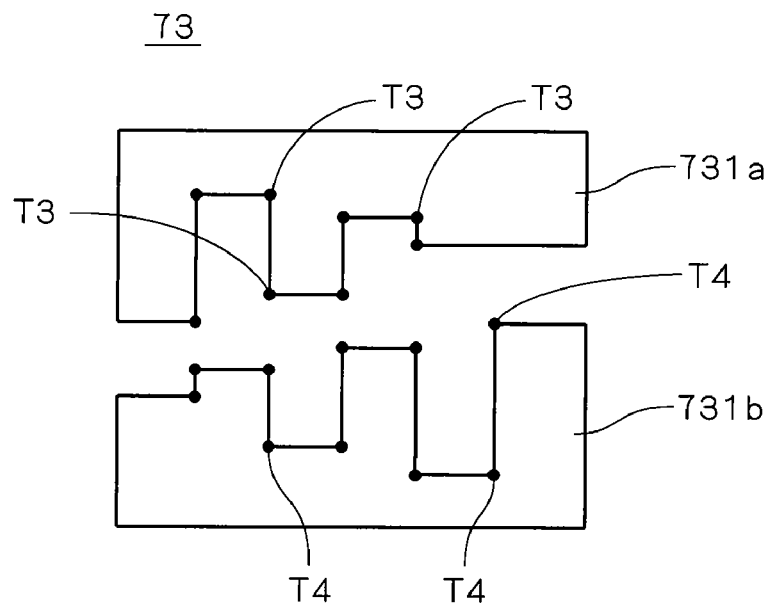
F I G. 17
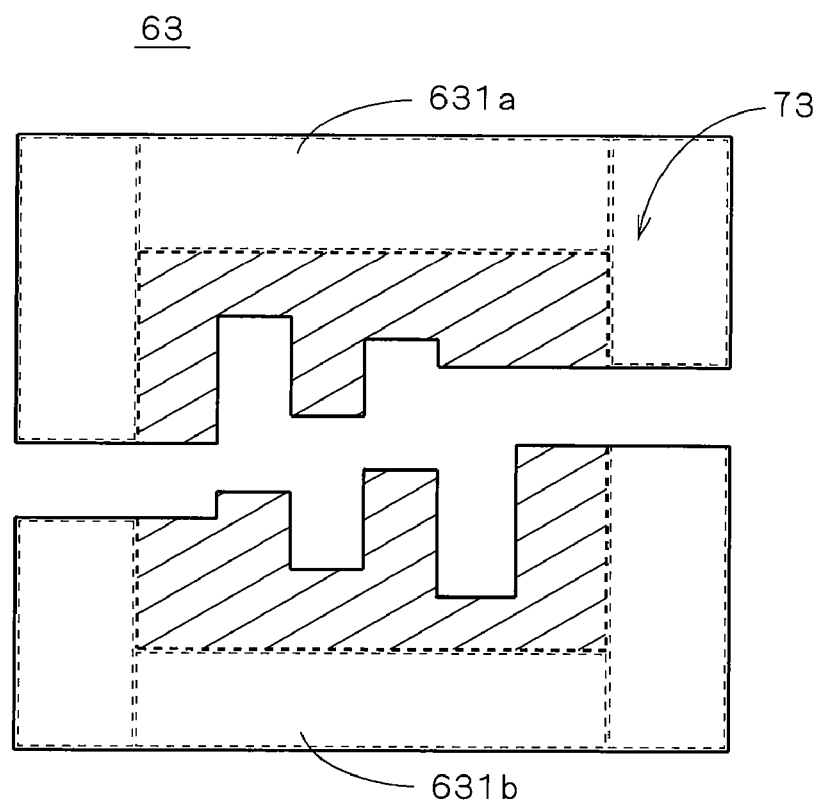

F I G. 18A
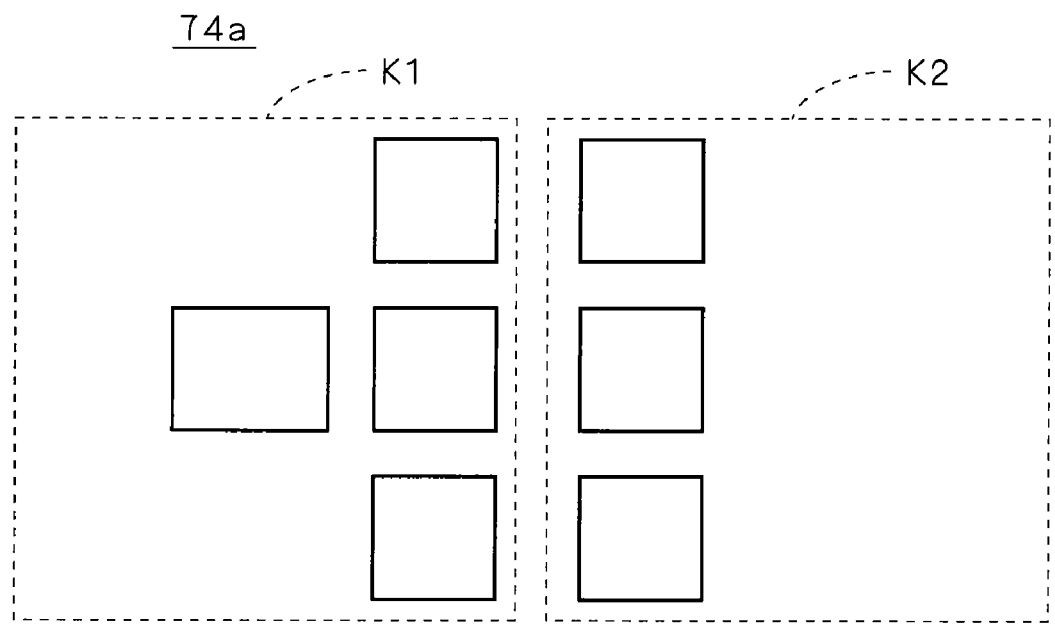
F I G. 18B
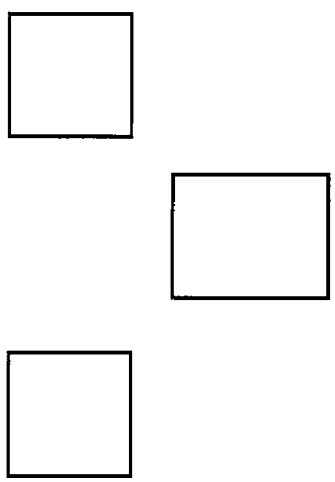

F I G. 25
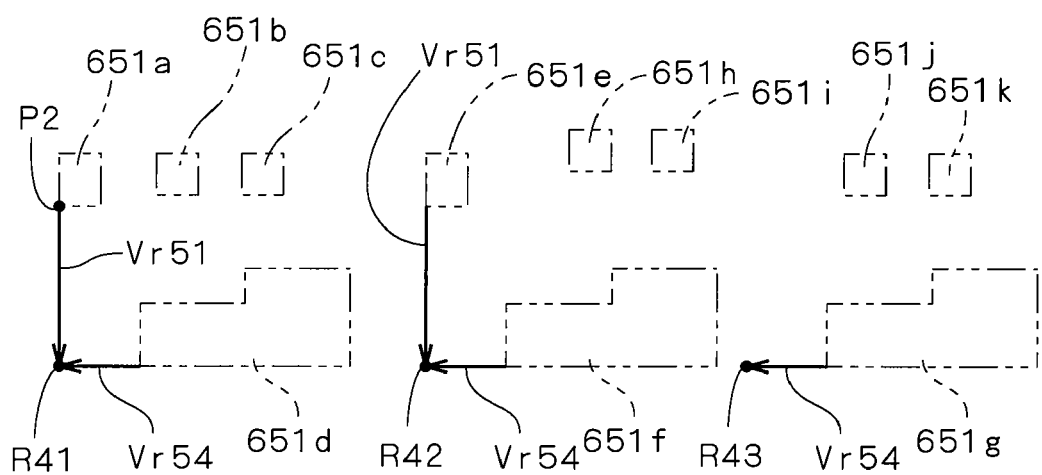
F I G. 26
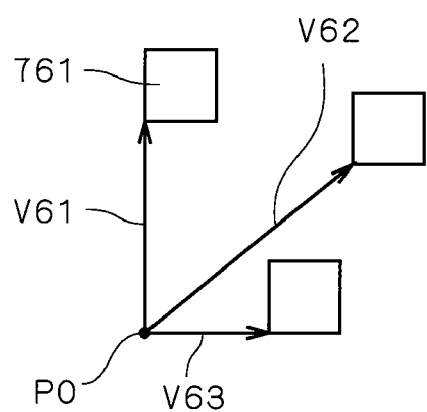

FIXED PATTERN EXTRACTING APPARATUS, PATTERN WRITING APPARATUS, FIXED PATTERN EXTRACTING METHOD AND RECORDING MEDIUM

BACKGROUND OF THE INVENTION

1. Field of the Invention

The present invention relates to a technique for extracting a fixed pattern in which a plurality of fixed pattern elements are arranged from a writing pattern in which a plurality of writing pattern elements are arranged to be written on a substrate and also relates to a pattern writing apparatus for writing a pattern on the substrate.

2. Description of the Background Art

In recent years, with high integration of LSIs (Large Scale Integrated Circuits) formed on a semiconductor substrate (hereinafter, referred to as "substrate"), a pattern writing apparatus (also referred to as "electron beam exposure apparatus") for emitting an electron beam to write a pattern has come into use. In the pattern writing apparatus, each of a plurality of writing pattern elements representing a writing pattern to be written on a substrate is divided into a plurality of rectangle pattern elements, and writing is performed while a sectional shape of electron beam is changed in accordance with each of a plurality of divided pattern elements. For a speed-up of writing in the pattern writing apparatus, a technique (character projection) is being adopted, in which a mask having an opening pattern in conformity with a predetermined fixed polygonal element is prepared and the fixed polygonal element in the writing pattern is written by using the mask.

The character projection requires an operation of extracting a fixed polygonal element from a writing pattern in which a plurality of writing pattern elements are arranged. Japanese Patent No. 3266327 (Document 1), for example, discloses a technique where if respective incoming vectors and outgoing vectors of a predetermined reference point of a fixed polygonal element and a given vertex of a writing pattern element coincide with each other, this vertex of the writing pattern element is determined as a candidate point and respective position vectors of remaining vertices with the reference point of the fixed polygonal element as a point of origin are calculated, and if remaining vertices of the writing pattern element exist at positions specified by the position vectors with the candidate point of the writing pattern element as a point of origin and the number of vertices of the fixed polygonal element and that of the writing pattern element coincide with each other, this writing pattern element is extracted as the fixed polygonal element.

For further speed-up of writing in the pattern writing apparatus, it is preferable that a fixed pattern in which a plurality of fixed pattern elements are arranged should be written by using a mask at a time (at a plurality of times, depending on the size of the fixed pattern). It is not easy, however, to extract a fixed pattern in which a plurality of fixed pattern elements are arranged from a writing pattern, and even if all the combinations of writing pattern elements in the writing pattern are detected to be compared with the fixed pattern, it takes a long time to perform such an operation. Also by the method of Document 1, it is not possible to extract a plurality of fixed pattern elements from a writing pattern, in consideration of positional relation of the fixed pattern elements.

In a case where a writing pattern is represented by a data structure consisting of hierarchical structures (also referred to as cells), which indicate the kinds of shapes of writing pattern elements and their layout, if a name of a structure coincident with a fixed pattern represented by an opening pattern on a mask is already known, it is possible to extract the fixed pattern from the writing pattern on the basis of the name of the structure, but if a name of a structure in an inputted writing pattern, which corresponds to an opening pattern on a mask, is not known, (for example, when a writing pattern named in accordance with a naming rule different from a naming rule used in mask formation is inputted), it is not possible to extract a fixed pattern from the writing pattern.

SUMMARY OF THE INVENTION

The present invention is intended for a fixed pattern extracting apparatus for extracting a fixed pattern in which a plurality of fixed pattern elements are arranged from a writing pattern in which a plurality of writing pattern elements are arranged to be written on a substrate, and it is an object of the present invention to extract a fixed pattern from a writing pattern at high speed.

According to the present invention, the fixed pattern extracting apparatus comprises a memory for storing fixed pattern information indicating respective shapes of a plurality of fixed pattern elements included in a fixed pattern and respective position vectors of the plurality of fixed pattern elements with respect to a predetermined reference position in the fixed pattern, a pattern element specifying part for specifying a plurality of key pattern elements coincident with or including any of the plurality of fixed pattern elements from a plurality of writing pattern elements included in a writing pattern with reference to the fixed pattern information, an accumulator for adding a predetermined value to a position designated by a reverse vector of the position vector of a corresponding fixed pattern element with each of the plurality of key pattern elements as a starting point in an initialized two-dimensional area that is an area which corresponds to the writing pattern and has positions each of which can store a value, and a position detecting part for detecting an existing position of the fixed pattern in the writing pattern by specifying a position to which a value is given, which corresponds to the number of the plurality of fixed pattern elements in the two-dimensional area after additions of values for all the plurality of key pattern elements are completed by the accumulator. By the fixed pattern extracting apparatus of the present invention, it is possible to extract a fixed pattern from a writing pattern at high speed.

According to one preferred embodiment of the present invention, a plurality of feature vertices are determined in advance for each of the plurality of fixed pattern elements, which exist in sequence along its polygonal-line contour, and the pattern element specifying part specifies a candidate pattern element out of the plurality of writing pattern elements, which has a plurality of vertices which have the same relative positional relation with the plurality of feature vertices and exist in sequence along its polygonal-line contour and further specifies the candidate pattern element as a key pattern element if remaining vertices of a fixed pattern element having the plurality of feature vertices are positioned on the candidate pattern element when the plurality of feature vertices and the plurality of vertices of the candidate pattern element overlap each other. It is thereby possible to appropriately specify even a key pattern element having a shape different from the fixed pattern elements, out of a plurality of writing pattern elements.

According to another preferred embodiment of the present invention, a plurality of fixed patterns are prepared and the accumulator sets the two-dimensional area individually for each of the plurality of fixed patterns, and further if at least part of existing area of one fixed pattern in the writing pattern overlaps at least part of existing area of another fixed pattern, an evaluation value obtained by subtracting the number of writing operations for writing the one fixed pattern from a division number by which the one fixed pattern is divided into rectangle pattern elements is compared with an evaluation value obtained by subtracting the number of writing operations for writing the another fixed pattern from a division number by which the another fixed pattern is divided into rectangle pattern elements and only either of the one fixed pattern and the another fixed pattern, which has a larger evaluation value, is extracted from the writing pattern. It is thereby possible to extract a desired fixed pattern even if an existing area of one fixed pattern overlaps that of another fixed pattern.

According to another preferred aspect of the present invention, the fixed pattern extracting apparatus comprises a memory for storing fixed pattern information indicating respective shapes of a plurality of fixed pattern elements included in a fixed pattern and respective position vectors of the plurality of fixed pattern elements with respect to a predetermined reference position in the fixed pattern and shape information of frequently-used pattern element which indicates a frequently-used shape of predetermined frequently-used pattern elements, each of which has said frequently-used shape, included in a plurality of writing pattern elements in a writing pattern, a pattern element specifying part for specifying at least one key pattern element, from the plurality of writing pattern elements, coincident with or including any of at least one selected fixed pattern element other than at least one pattern element having the frequently-used shape among the plurality of fixed pattern elements with reference to the fixed pattern information and the shape information of frequently-used pattern element, a positions information generator for generating position information of frequently-used pattern element which indicates the positions of the frequently-used pattern elements in the writing pattern, which is specified from the plurality of writing pattern elements, an accumulator for adding a predetermined value to a position designated by a reverse vector of the position vector of a corresponding fixed pattern element with each of at least one key pattern element as a starting point in an initialized two-dimensional area that is an area which corresponds to the writing pattern and has positions each of which can store a value, a first position detecting part for detecting a candidate existing position of the fixed pattern in the writing pattern by specifying a position to which a value is given, which corresponds to the number of at least one selected fixed pattern element in the two-dimensional area after additions of values for all at least one key pattern element are completed by the accumulator, and a second position detecting part for detecting the candidate existing position as a final existing position of the fixed pattern if it is confirmed on the basis of the position information of frequently-used pattern element that when the fixed pattern is arranged at the candidate existing position in the writing pattern, any of the frequently-used pattern elements included in the writing pattern exists at position of each of at least one pattern element which is included in the fixed pattern and each has the frequently-used shape. By the fixed pattern extracting apparatus of this aspect, it is possible to extract a fixed pattern at higher speed if frequently-used pattern elements exist.

The present invention is also intended for a pattern writing apparatus for writing a pattern on a substrate, a fixed pattern extracting method for extracting a fixed pattern from a writing pattern, and a computer-readable recording medium carrying a program for causing a computer to extract a fixed pattern from a writing pattern.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a view showing a writing pattern;
FIG. 14 is a view showing a fixed pattern;
FIG. 15 is a view showing a result of extraction of the fixed pattern from the writing pattern;
FIG. 16 is a view showing a fixed pattern;
FIG. 17 is a view showing a writing pattern;
FIGS. 18A and 18B are views showing fixed patterns;
FIG. 25 is a view showing a setting area;
FIG. 26 is a view showing a fixed pattern.

DESCRIPTION OF THE PREFERRED EMBODIMENTS

Figure 1:
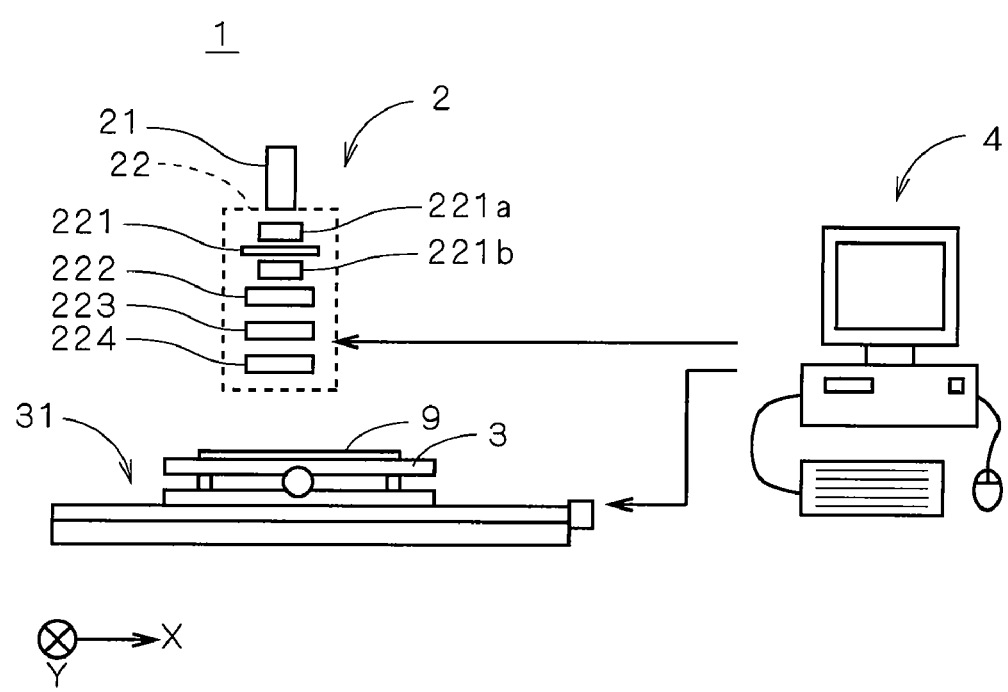
FIG. 1 is a view showing a structure of a pattern writing apparatus.

FIG. 1 is a view showing an overall structure of a pattern writing apparatus 1 in accordance with a first preferred embodiment of the present invention. The pattern writing apparatus 1 comprises a head part 2 for emitting an electron beam for writing, a stage 3 for holding a semiconductor substrate 9, a stage driving part 31 for moving the stage 3 relatively to the head part 2, and a computer 4 connected to the head part 2 and the stage driving part 31. The computer 4 controls the constituent elements of the pattern writing apparatus 1. The stage driving part 31 has a mechanism for moving the stage 3 toward an X direction and a Y direction of FIG. 1.

The head part 2 has a beam emission part 21 for emitting an electron beam to the substrate 9 and an optical unit 22 for guiding the electron beam to the substrate 9. The optical unit 22 has a mask part 221 in which a plurality of opening patterns corresponding to a plurality of kinds of fixed patterns (i.e., predetermined patterns) are formed, a beam shape changing part 222 for changing the sectional shape of the electron beam as necessary, an irradiation position changing part 223 for changing an irradiation position of electron beam on the substrate 9 by deflecting the electron beam and an objective lens part 224 for converging the electron beam to be guided to the substrate 9. The fixed pattern refers to a pattern in which a plurality of polygonal pattern elements are arranged, and in the following discussion, each pattern element included in the fixed pattern is referred to as a fixed pattern element.

On both sides of the mask part 221, i.e., on the side facing the beam emission part 21 and on the side facing the beam shape changing part 222, deflectors 221a and 221b are provided, respectively, and the electron beam emitted from the beam emission part 21 is deflected by the deflector 221a and enter a desired position on the mask part 221. In other words, the electron beam from the beam emission part 21 can be selectively emitted to an area including each opening pattern on the mask part 221. The cross section of the electron beam passing the mask part 221 is thereby formed into the same shape as a fixed pattern corresponding to this opening pattern. The electron beam passing the mask part 221 is deflected by the deflector 221b and enter the beam shape changing part 222.

The cross section of the electron beam is formed into a desired shape (e.g., various rectangles and triangles) by a plurality of apertures in the beam shape changing part 222 as necessary and then an operation of deflection of the electron beam with respect to a main scan (the scan across predetermined areas on the substrate 9) and a subscan (the scan in each area) is performed in the irradiation position changing part 223. After that, the electron beam is converged by the objective lens part 224 on the substrate 9 and emitted to the substrate 9. In the optical unit 22, the mask part 221 and the beam shape changing part 222 are arranged at conjugate positions with respect to a surface of the substrate 9. The arrangement of the mask part 221, the beam shape changing part 222, the irradiation position changing part 223 and the objective lens part 224 is not limited to the above one but the order of arranging the constituents and part of layout of the constituents may be changed as appropriate. The irradiation position of the electron beam on the mask part 221 may be changed by providing a mechanism for moving the mask part 221 in a direction perpendicular to an optical axis.

Figure 2:
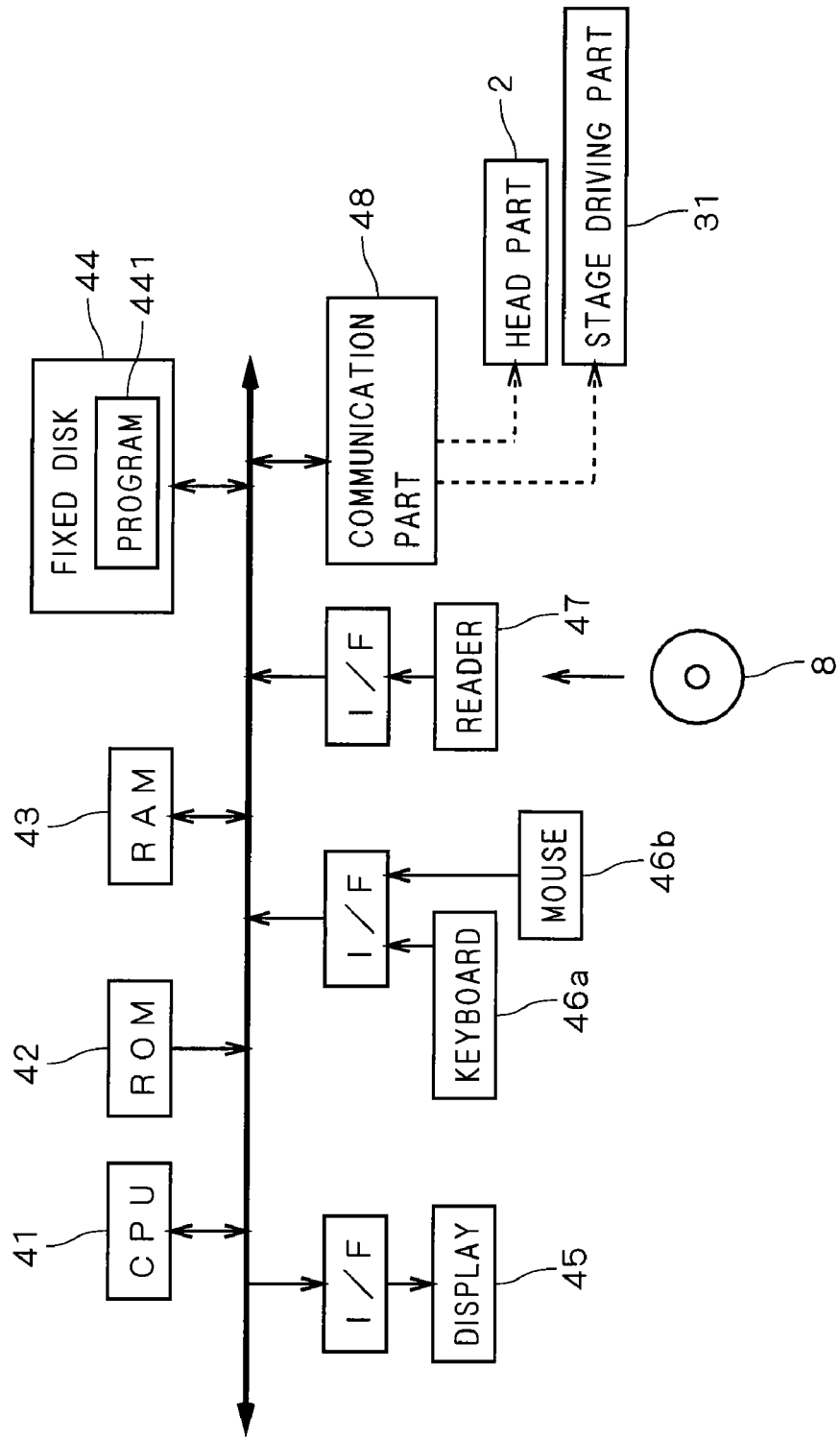
FIG. 2 is a view showing a constitution of a computer.

The computer 4 has a constitution of general computer system, as shown in FIG. 2, where a CPU 41 for performing various computations, a ROM 42 for storing a basic program and a RAM 43 for storing various information are connected to a bus line. To the bus line, a fixed disk 44 for storing information, a display 45 for displaying various information, a keyboard 46a and a mouse 46b for receiving an input from an operator, a reader 47 for reading information from a computer-readable recording medium 8 such as an optical disk, a magnetic disk or a magneto-optic disk, and a communication part 48 for sending a control signal to the head part 2 and the stage driving part 31 are further connected through an interface (I/F) as appropriate.

A program 441 is read out from the recording medium 8 through the reader 47 into the computer 4 and stored into the fixed disk 44 in advance. The program 441 is copied to the RAM 43 and the CPU 41 executes computation in accordance with the program stored in the RAM 43 (in other words, the computer executes the program), and the computer 4 thereby performs operations as the fixed pattern extracting apparatus for extracting a fixed pattern from a pattern to be written on the substrate 9.

Figure 3:
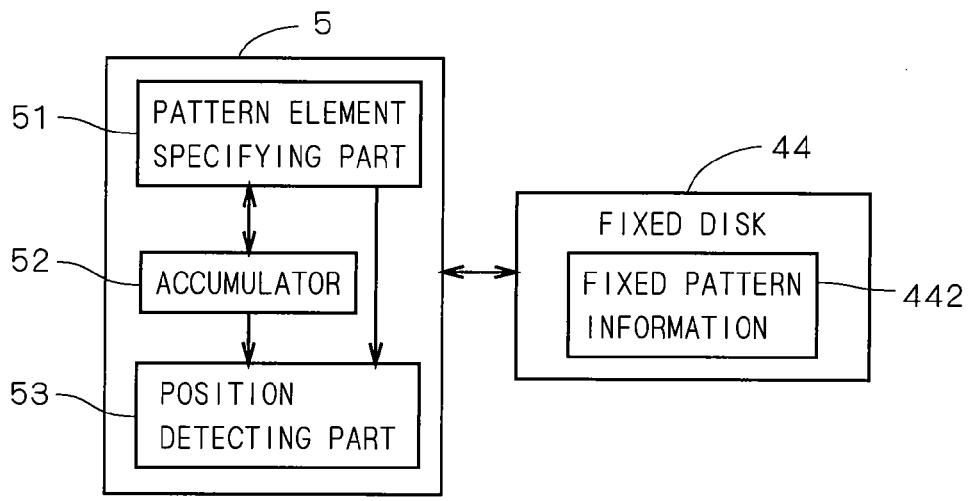
FIG. 3 is a block diagram showing a structure of functions implemented by the computer.

FIG. 3 is a block diagram showing a structure of functions implemented by the CPU 41, the ROM 42, the RAM 43, the fixed disk 44 and the like when the CPU 41 operates in accordance with the program 441. Specifically, FIG. 3 shows the functions of a processing part 5 (a pattern element specifying part 51, an accumulator 52 and a position detecting part 53) implemented by the CPU 41 and the like. These functions may be implemented by dedicated electric circuits, or may be partially implemented by the electric circuits.

In performing a writing operation by the pattern writing apparatus 1, data indicating a writing pattern in which a plurality of polygonal pattern elements (hereinafter, referred to as "writing pattern elements") to be written on the substrate 9 are arranged is inputted to the computer 4. The writing pattern represents a pattern to be written on part (may be the whole) of an area which corresponds to one semiconductor chip on the substrate 9.

Figure 4:
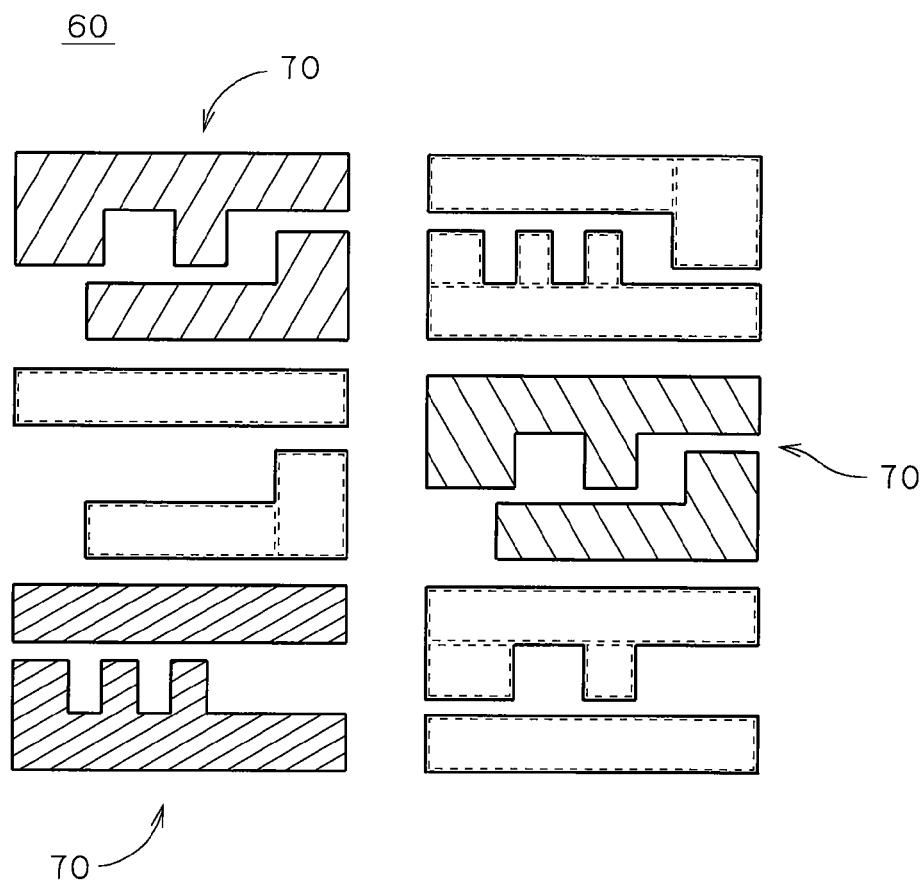
FIG. 4 is a view showing a writing pattern.

FIG. 4 is a view showing one example of a writing pattern 60. In the computer 4, the processing part 5 performs an operation discussed later to detect an existing position of each of fixed patterns 70 (in FIG. 4, a combination of pattern elements with the same hatch is referred to as a fixed pattern 70) in the writing pattern 60 and extract the fixed pattern 70 from the writing pattern 60. In the writing pattern 60, each of remaining writing pattern elements (hereinafter, referred to as "division target pattern elements") after the extraction of the fixed pattern 70 is divided into a plurality of rectangle pattern elements by a predetermined technique as indicated by broken lines of FIG. 4. Then, information indicating the kind of each fixed pattern 70 in the writing pattern 60 and its existing position and information indicating the result of dividing the division target pattern element are generated as pattern element writing data.

The computer 4 controls the stage driving part 31 of FIG. 1 to move a portion which corresponds to one semiconductor chip on the substrate 9 to a position directly below the head part 2 and performs a writing operation in a predetermined area of one chip. In the pattern writing operation, to write each of the fixed patterns 70 in the writing pattern 60, an irradiation position of electron beam on the mask part 221 is changed to an opening pattern corresponding to this fixed pattern 70 and the size of opening by a plurality of apertures in the beam shape changing part 222 is made large enough not to interfere the electron beam passing the mask part 221. The irradiation position of the electron beam on the substrate 9 is changed by the irradiation position changing part 223, to an existing position of the fixed pattern detected by the processing part 5 and an image of the opening pattern is formed on the substrate 9, thus the fixed pattern being written.

In the pattern writing operation, to write each division target pattern element in the writing pattern, an irradiation position of the electron beam on the mask part 221 is changed to a large opening area which is formed separately from the opening pattern on the mask part 221 and the electron beam is guided to the beam shape changing part 222, almost none of which being shaped. While, the cross section of the electron beam is shaped by the beam shape changing part 222 in accordance with each of divided rectangle pattern elements included in the division target pattern element, the electron beam is emitted to a corresponding position on the substrate 9, and rectangle pattern elements are thereby written on the substrate 9. Thus, in the pattern writing apparatus 1, a sectional shape of the electron beam emitted onto the substrate 9 is changed in accordance with the pattern element writing data, by the mask part 221 or the beam shape changing part 222 disposed on a path of the electron beam from the beam emission part 21 to the substrate 9 on the stage 3, and the whole writing pattern 60 is written on the substrate 9.

Figure 5:
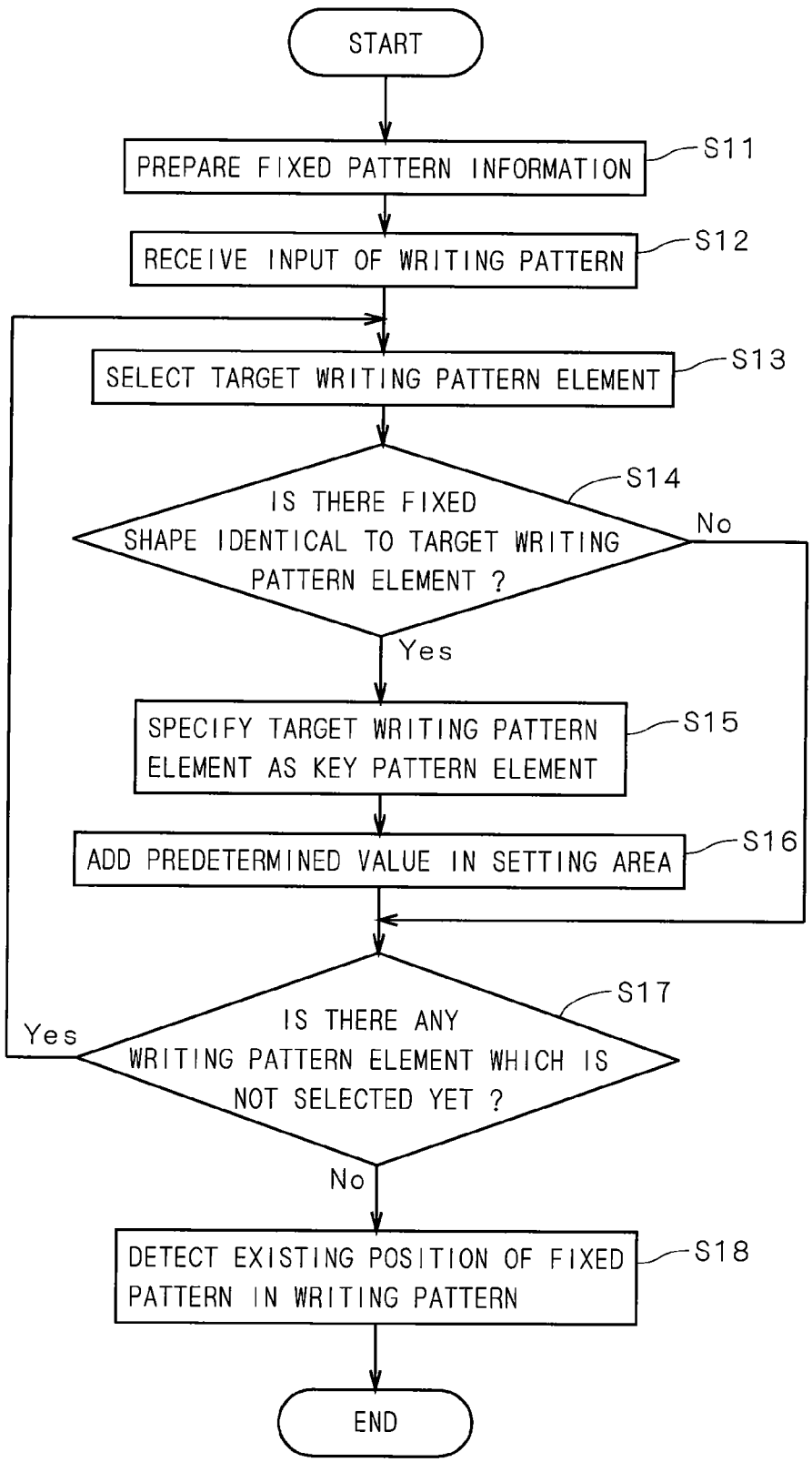
FIG. 5 is a flowchart showing an operation flow for extracting a fixed pattern from a writing pattern.

Next, discussion will be made on an operation by the processing part 5 of FIG. 3, which is implemented by the computer 4. FIG. 5 is a flowchart showing an operation flow of the computer 4 for extracting a fixed pattern from a writing pattern. In the computer 4, first, fixed pattern information 442 indicating a plurality of fixed patterns corresponding to a plurality of opening patterns in the mask part 221 is inputted by an operator through the keyboard 46a, the reader 47 and the like and stored in the fixed disk 44, being thus prepared (Step S111).

Figure 6A:
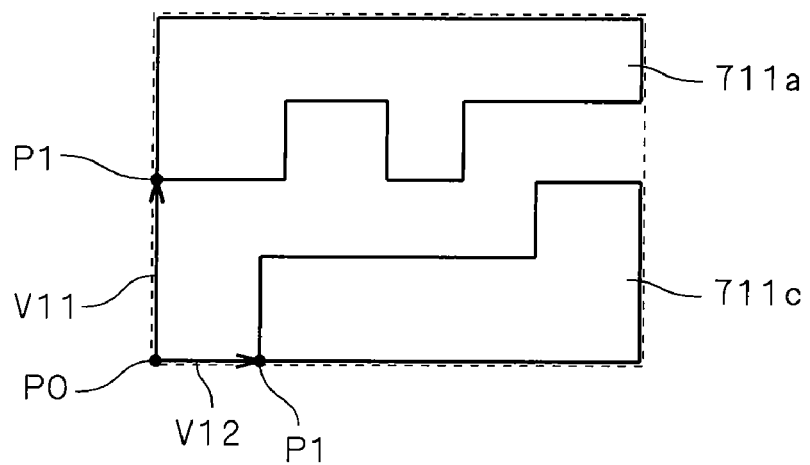
FIGS. 6A, 6B and 6C are views each showing a fixed pattern.
Figure 6B:
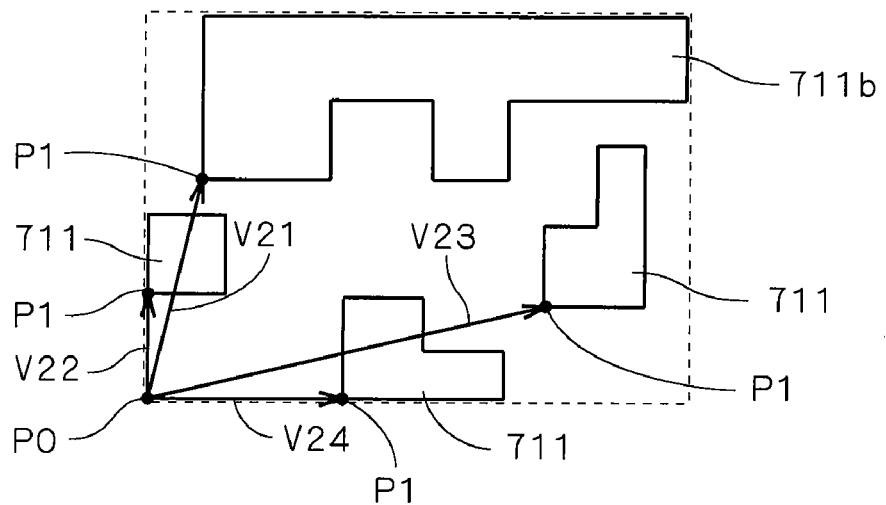
Figure 6C:
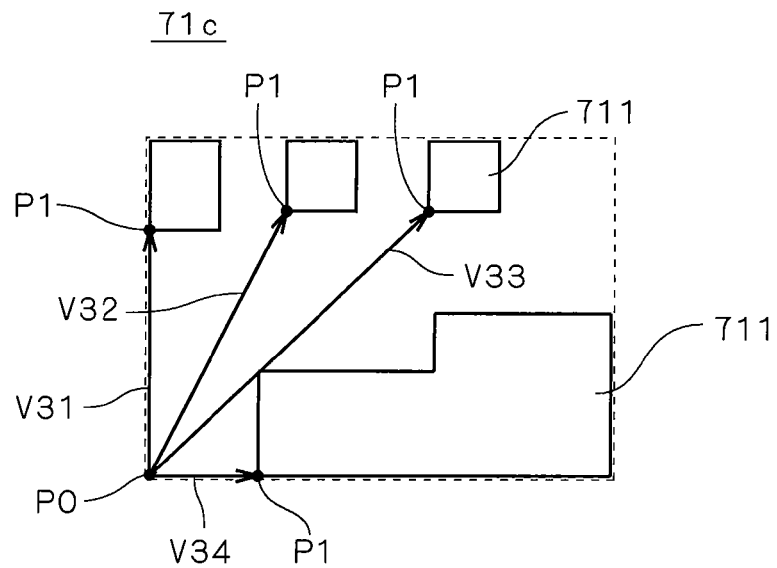
Figure 7:
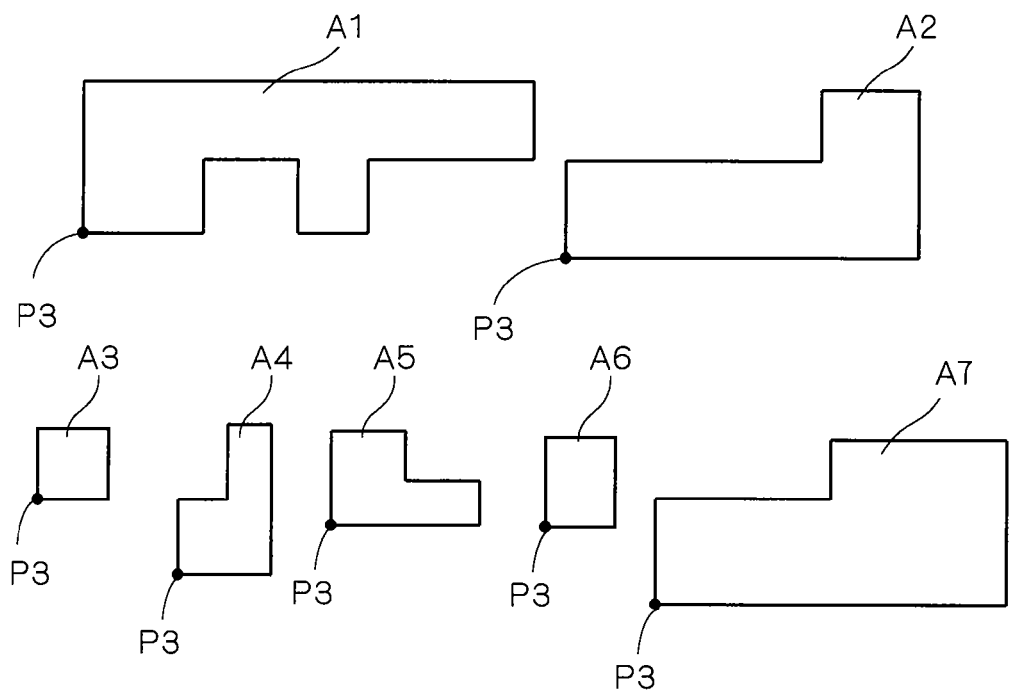
FIG. 7 is a view showing the kinds of shapes of fixed pattern elements included in the fixed patterns.

FIGS. 6A to 6C are views showing fixed patterns 71a, 71b and 71c, respectively, indicated by the fixed pattern information 442. FIG. 7 is a view showing the kinds of shapes of fixed pattern elements included in the fixed patterns 71a to 71c, and in this figure, shapes of the fixed pattern elements (hereinafter, referred to as "fixed shapes") are represented by reference signs A1 to A7. As shown in FIGS. 6A to 6C, a plurality of fixed pattern elements 711 (two fixed pattern elements of FIG. 6A and one fixed pattern element of FIG. 6B are represented by reference signs 711a, 711c and 711b, respectively) are arranged in each of the fixed patterns 71a to 71c, and in this preferred embodiment, each of the fixed patterns 71a to 71c is represented by a combination of the kind of fixed shape of each fixed pattern element 711 included in the fixed pattern 71a, 71b or 71c and a position vector of a reference vertex (the vertex of the fixed pattern element 711 having the minimum coordinates, which is represented by the reference sign P1 in FIGS. 6A to 6C) which is positioned at lower left in the fixed pattern element 711 (or nearest to the lower-left vertex of the circumscribed rectangle of the fixed pattern element 711) with respect to a predetermined reference position P0 of the fixed pattern 71a, 71b or 71c (a lower-left vertex of the circumscribed rectangle of the fixed pattern 71a, 71b or 71c, which is indicated by a broken line in FIGS. 6A to 6C).

Specifically, the fixed pattern 71a of FIG. 6A is represented as "a fixed pattern element of fixed shape A1 is arranged at a position of vector V11; and a fixed pattern element of fixed shape A2 is arranged at a position of vector V12". The fixed pattern 71b of FIG. 6B is represented as "a fixed pattern element of fixed shape A1 is arranged at a position of vector V21; a fixed pattern element of fixed shape A3 is arranged at a position of vector V22; a fixed pattern element of fixed shape A4 is arranged at a position of vector V23; and a fixed pattern element of fixed shape A5 is arranged at a position of vector V24". The fixed pattern 71c of FIG. 6C is represented as "a fixed pattern element of fixed shape A6 is arranged at a position of vector V31; a fixed pattern element of fixed shape A3 is arranged at a position of vector V32; a fixed pattern element of fixed shape A3 is arranged at a position of vector V33; and a fixed pattern element of fixed shape A7 is arranged at a position of vector V34". In the FIGS. 6A to 6C, the position vectors are indicated by arrows. In each fixed pattern element 711 in FIGS. 6A to 6C, the reference vertex P1 may be a position other than the lower-left vertex.

The fixed pattern information 442 includes information indicating the fixed shapes A1 to A7 of FIG. 7 and the above information representing each of the fixed patterns 71a to 71c. Therefore, the fixed pattern information 442 is prepared substantially as information indicating the respective shapes of a plurality of fixed pattern elements 711 included in each of the fixed patterns 71a to 71c and the position vectors of the fixed pattern elements 711 with respect to the predetermined reference position P0 in the fixed pattern 71a, 71b or 71c.

After the fixed pattern information 442 is prepared, data indicating a writing pattern is inputted by an operator through the reader 47 and the like to the computer 4 and stored into the fixed disk 44 (Step S12). Then the writing pattern is outputted from the fixed disk 44 to the processing part 5.

Figure 8:
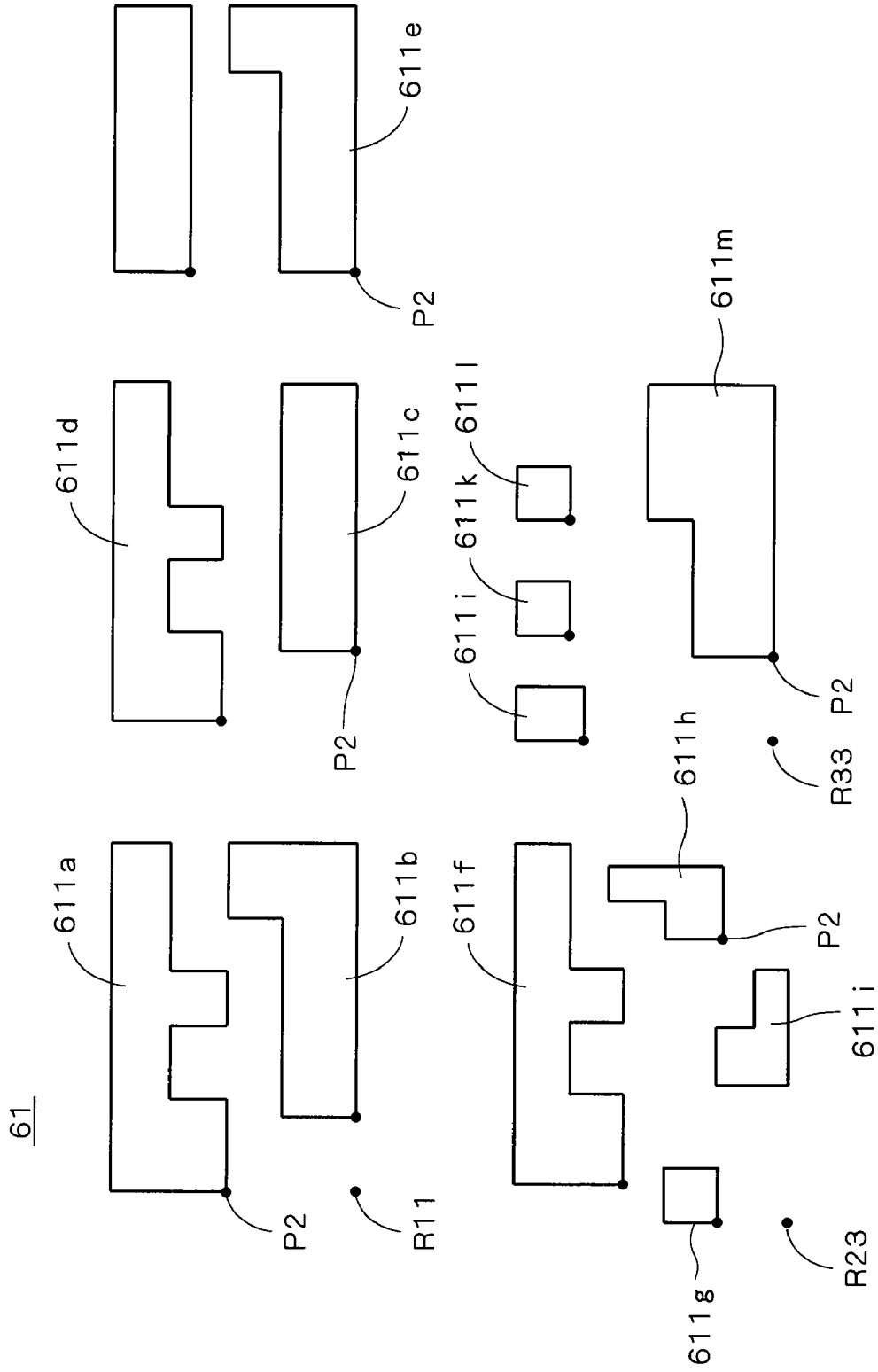
FIG. 8 is a view showing a writing pattern.

FIG. 8 is a view showing a writing pattern 61. In the writing pattern 61 of FIG. 8, a plurality of writing pattern elements of various polygons are arranged. The writing pattern is represented by information indicating the shape of each writing pattern element included in the writing pattern by positions of its vertices and information indicating kinds of shapes of the writing pattern elements and those arrangements by a hierarchical data structure. In the information indicating the shape of the writing pattern element, there is a case where a position on line segment which corresponds to a side of the polygon is shown as a vertex even though the position is not actually a vertex, but such an unnecessary vertex is deleted in advance by a predetermined preliminary processing. In representing the writing pattern by the above data structure, there is a case where a plurality of writing pattern elements of the same shape are overlappingly arranged at the same position, and the countermeasure for such a case will be discussed later.

In the pattern element specifying part 51, a writing pattern element represented by reference sign 611a in the writing pattern 61 of FIG. 8 is selected as a writing pattern element to be processed (hereinafter, referred to as "target writing pattern element") (Step S13) and the respective positions (coordinates) of vertices of the target writing pattern element 611a are sequentially obtained in a counterclockwise direction (may be in a clockwise direction, the same applies to the following) along its polygonal-line contour with the lower-left reference vertex (the vertex represented by reference sign P2 in FIG. 8) of the target writing pattern element 611a as a point of origin.

On the other hand, with respect to each of the fixed shapes A1 to A7 of FIG. 7, from the fixed pattern information 442, the respective positions of vertices in sequence along the polygonal-line contour of each fixed shape are sequentially obtained in a counterclockwise direction with its lower-left reference vertex P3 of FIG. 7 as a point of origin. The respective positions of vertices of the target writing pattern element 611a in the order of acquisition are individually compared with the corresponding positions of the vertices of each of the fixed shape A1 to A7 in the same order of acquisition, and if all the positions of the vertices coincide with each other between the target writing pattern element 611a and a fixed shape, it is determined that the target writing pattern element 611a and this fixed shape have the same shape. In this manner, it is checked if there is a fixed shape among the fixed shapes A1 to A7 that has the same shape as the target writing pattern element 611a. In this case, since the respective positions of the vertices of the target writing pattern element 611a coincide with the respective positions of corresponding vertices of the fixed shape A1, it is confirmed that the target writing pattern element 611a is identical to the fixed shape A1 (Step S14). The target writing pattern element 611a is thereby specified as a key pattern element for the fixed pattern including the fixed shape A1 (Step S15). Actually, since the fixed pattern element represented by reference sign 711a in the fixed pattern 71a of FIG. 6A and the fixed pattern element represented by reference sign 711b in the fixed pattern 71b of FIG. 6B correspond to the fixed shape A1, the target writing pattern element 611a is specified as a key pattern element for the fixed patterns 71a and 71b.

In the accumulator 52, a two-dimensional area (hereinafter, referred to as "setting area") in which the whole writing pattern 61 can be arranged, which has positions each of which a value can be stored in is set for each of the fixed patterns 71*a* to 71*c* by allocating a storage area of the RAM 43 for each setting area. In the first operation by the accumulator 52, 0 (zero) is given to all the positions of each setting area and the setting area is thereby initialized.

Figure 9A:
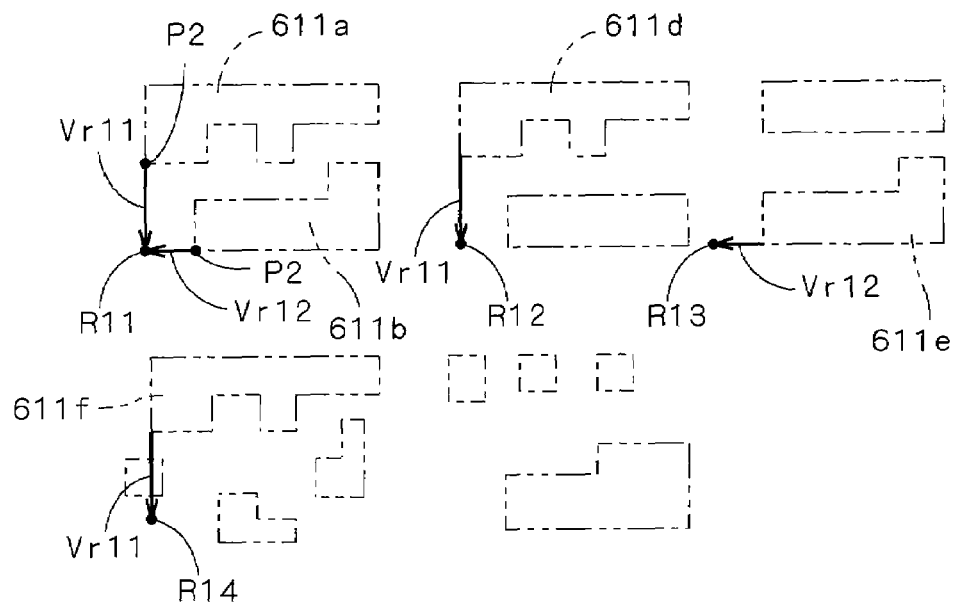
FIGS. 9A, 9B and 9C are views showing setting areas.
Figure 9B:
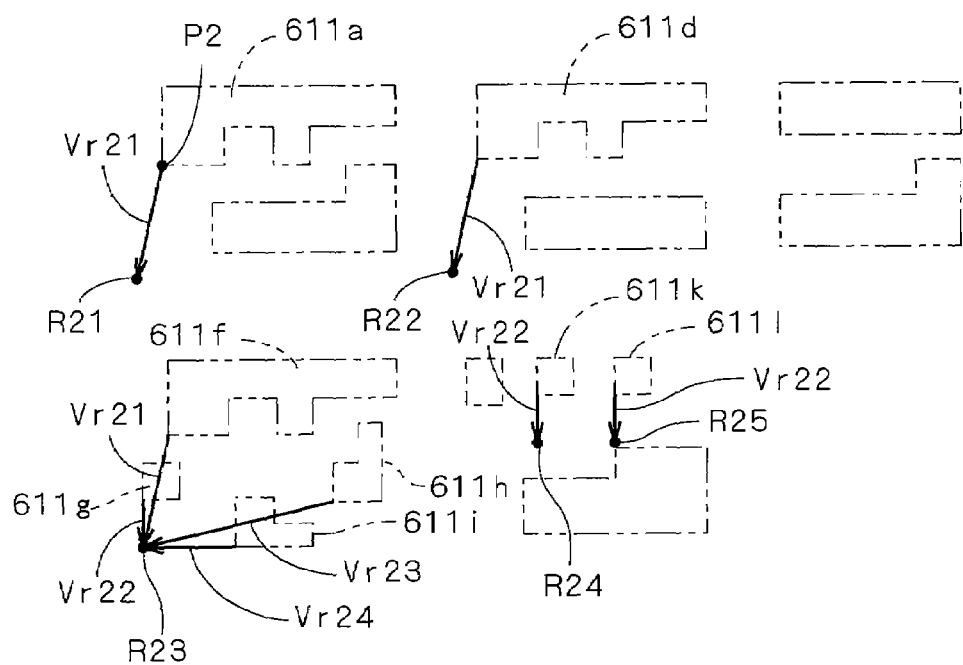
Figure 9C:
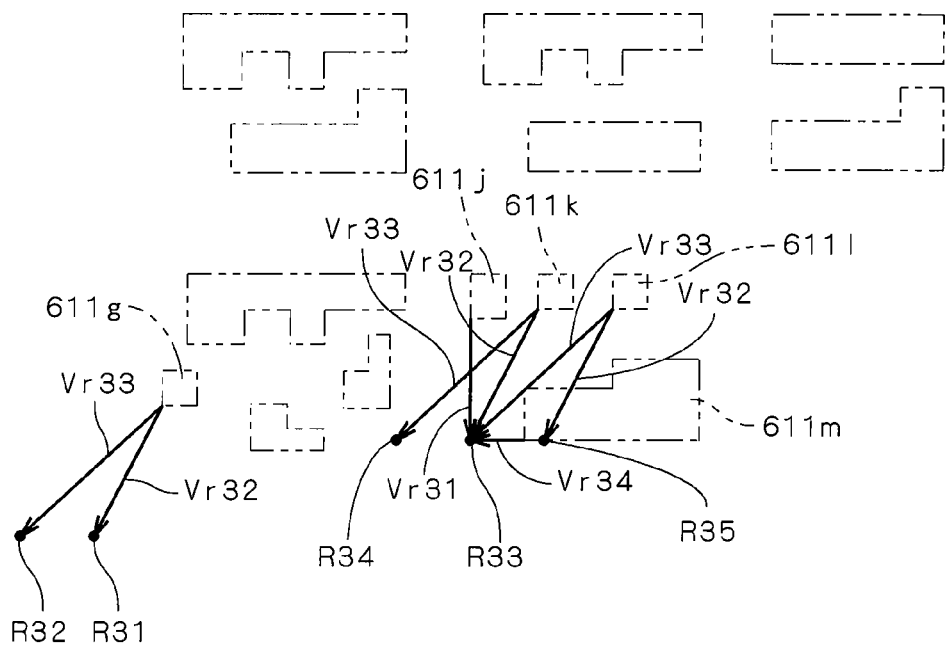

FIGS. 9A to 9C are views showing the setting areas for the fixed patterns 71*a* to 71*c*, respectively. The accumulator 52 performs additions of values in the respective setting areas for the fixed patterns 71*a* and 71*b* with the target writing pattern element 611*a* as their key pattern element (Step S16). Specifically, in the setting area of FIG. 9A for the fixed pattern 71*a* including the fixed pattern element 711*a*, with the reference vertex P2 of the target writing pattern element 611*a* which is the key pattern element as a starting point, a position R11 designated by a reverse vector of the position vector V11 of the fixed pattern element 711*a* (which is indicated by the arrow Vr11 in FIG. 9A, the same applies to the following) is calculated and a predetermined value (e.g., "1") is added to the position R11. Similarly, in the setting area of FIG. 9B for the fixed pattern 71*b* including the fixed pattern element 711*b*, with the reference vertex P2 of the target writing pattern element 611*a* which is the key pattern element as a starting point, a value of "1" is added to a position R21 designated by a reverse vector Vr21 of the position vector V21 of the fixed pattern element 711*b*. Since the target writing pattern element 611*a* is not a key pattern element for the fixed pattern 71*c*, no value is added to any position of the setting area of FIG. 9C.

After the additions of values to the setting areas, in the pattern element specifying part 51, it is checked if there is any writing pattern element which is not selected yet in the writing pattern 61 of FIG. 8. In this case, since there is a writing pattern element which is not selected yet (Step S17), the writing pattern element represented by reference sign 611*b* in FIG. 8 is selected as a next target writing pattern element (Step S13). Then, in the same technique as above, it is confirmed that the target writing pattern element 611*b* is identical to the fixed shape A2 (Step S14), and the target writing pattern element 611*b* is specified as a key pattern element for the fixed pattern 71*a* including a fixed pattern element which corresponds to the fixed shape A2 (the fixed pattern element represented by reference sign 711*c* in FIG. 6A).

In the accumulator 52, a value of "1" is added to the position R11 designated by a reverse vector Vr12 of the position vector V12 of the fixed pattern element 711*c* with a reference vertex P2 of the target writing pattern element 611*b* which is the key pattern element as a starting point in the setting area of FIG. 9A for the fixed pattern 71*a* (Step S16). Since the target writing pattern element 611*b* is not a key pattern element for the other fixed patterns 71*b* or 71*c*, no value is added to any positions of the setting areas in FIGS. 9B and 9C.

Subsequently, in the pattern element specifying part 51, the writing pattern element represented by reference sign 611*c* in the writing pattern 61 of FIG. 8 is selected as a next target writing pattern element (Steps S17 and S13). Then, it is confirmed that the target writing pattern element 611*c* is not identical to any one of the fixed shapes A1 to A7 in FIG. 7 (Step S14) and therefore, a next target writing pattern element is selected in the writing pattern 61 (Steps S17 and S13).

Thus, by repeating the above process steps S13 to S16 for all the writing pattern elements 611 included in the writing pattern 61 (Step S17), in the pattern element specifying part 51, with reference to the fixed pattern information 442, a plurality of key pattern elements which coincide with any of a plurality of fixed pattern elements 711 included in each of the fixed patterns 71*a* to 71*c* are specified individually for each of the fixed patterns 71*a* to 71*c* out of the plurality of writing pattern elements in the writing pattern 61, and in the accumulator 52, in the setting area for each of the fixed patterns 71*a* to 71*c*, with each of the plurality of key pattern elements for this fixed pattern 71*a*, 71*b* or 71*c* as a starting point, a predetermined value is added to a position designated by a reverse vector of the position vector of the corresponding fixed pattern element 711.

Actually from the above processing, in the setting area of FIG. 9A, besides the position R11 designated by the reverse vector Vr11 with the above-discussed writing pattern element 611*a* as a starting point and the position R11 designated by the reverse vector Vr12 with the above-discussed writing pattern element 611*b* as a starting point, a position R12 designated by the reverse vector Vr11 with a writing pattern element 611*id* as a starting point, a position R13 designated by the reverse vector Vr12 with a writing pattern element 611*e* as a starting point, and a position R14 designated by the reverse vector Vr11 with a writing pattern element 611*f* as a starting point are specified and the value of "1" is added to each of these positions, and finally, the value of the position R11 becomes "2", the values of the positions R12 to R14 each become "1" and the values of other positions each become "0".

In the setting area of FIG. 9B, besides the position R21 designated by the reverse vector Vr21 with the above-discussed writing pattern element 611*a* as a starting point, a position R22 designated by the reverse vector Vr21 with the writing pattern element 611*d* as a starting point, a position R23 designated by the reverse vector Vr21 with the writing pattern element 611*f* as a starting point, the position R23 designated by a reverse vector Vr22 with a writing pattern element 611*g* as a starting point, the position R23 designated by a reverse vector Vr23 with a writing pattern element 611*h* as a starting point, the position R23 designated by a reverse vector Vr24 with a writing pattern element 611*i* as a starting point, a position R24 designated by the reverse vector Vr22 with a writing pattern element 611*k* as a starting point, and a position R25 designated by the reverse vector Vr22 with a writing pattern element 611*l* as a starting point are specified and the value of "1" is added to each of these positions, and finally, the value of the position R23 becomes "4", the values of the positions R21, R22, R24 and R25 each become "1" and the values of other positions each become "0".

In the setting area of FIG. 9C, a position R31 designated by a reverse vector Vr32 with the writing pattern element 611*g* as a starting point, a position R32 designated by a reverse vector Vr33 with the writing pattern element 611*g* as a starting point, a position R33 designated by the reverse vector Vr31 with a writing pattern element 611*j* as a starting point, the position R33 designated by the reverse vector Vr32 with the writing pattern element 611*k* as a starting point, a position R34 designated by the reverse vector Vr33 with the writing pattern element 611*k* as a starting point, a position R35 designated by the reverse vector Vr32 with the writing pattern element 611*l* as a starting point, the position R33 designated by the reverse vector Vr33 with the writing pattern element 611*l* as a starting point, and the position R33 designated by the reverse vector Vr34 with a writing pattern element 611*m* as a starting point are specified and the value of "1" is added to each of these positions, and finally, the value of the position R33 becomes "4", the values of the positions R31, R32, R34 and R35 each become "1" and the values of other positions each become "0".

After the additions of values for all the key pattern elements in the writing pattern 61 are completed in each setting area (Step S17), the position detecting part 53 detects an existing position for each of the fixed patterns 71*a* to 71*c* in the writing pattern 61 (Step S18). Specifically, in the setting area of the fixed pattern 71a in FIG. 9A, the position R11 to which the value coincident with the number of fixed pattern elements 711a and 711c (i.e., "2") included in the fixed pattern 71a is given is specified and the position R11 in the writing pattern 61 of FIG. 8 is detected as an existing position of the fixed pattern 71a. The combination of writing pattern elements 611a and 611b which contribute to the addition of values to position R11 are extracted as the fixed pattern 71a from the writing pattern 61.

In the setting area of FIG. 9B for the fixed pattern 71b, the position R23 to which the value coincident with the number of fixed pattern elements 711 (i.e., "4") included in the fixed pattern 71b is given is specified and the position R23 in the writing pattern 61 of FIG. 8 is detected as an existing position of the fixed pattern 71b, and the combination of writing pattern elements 611f to 611i which contribute to the addition of values to position R23 are thereby extracted as the fixed pattern 71b from the writing pattern 61. In the setting area of FIG. 9C for the fixed pattern 71c, the position R33 to which the value coincident with the number of fixed pattern elements 711 (i.e., "4") included in the fixed pattern 71c is given is specified and the position R33 in the writing pattern 61 of FIG. 8 is detected as an existing position of the fixed pattern 71c, and the combination of writing pattern elements 611j to 611m which contribute to the addition of values to position R33 are thereby extracted as the fixed pattern 71c from the writing pattern 61. If there is no position in a setting area, to which the value coincident with the number of fixed pattern elements included in a fixed pattern is given, it is determined that this fixed pattern does not exist in the writing pattern.

Figure 10:
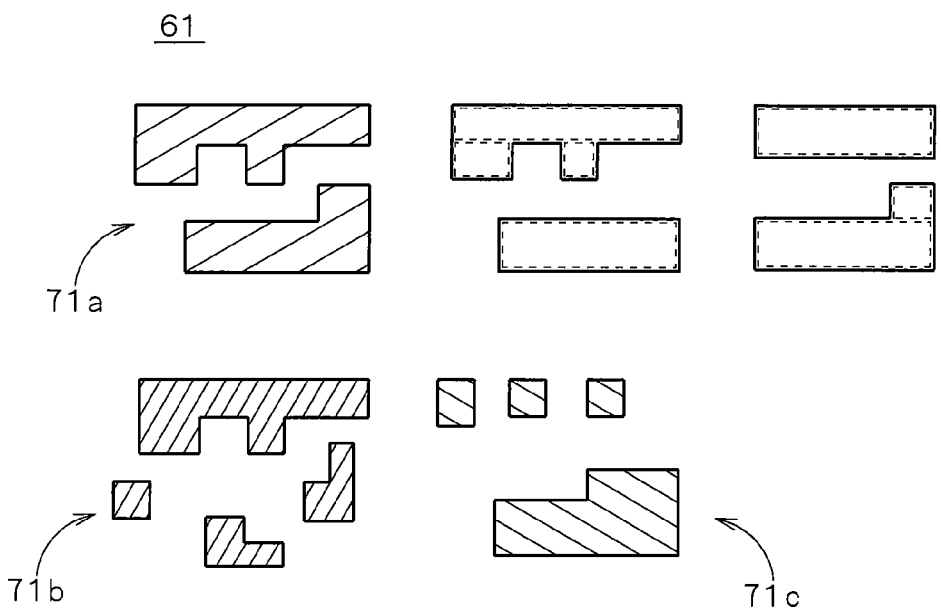
FIG. 10 is a view showing a result of extraction of the fixed pattern from the writing pattern.

FIG. 10 is a view showing a result of extraction of the fixed patterns 71a to 71c from the writing pattern 61. In FIG. 10, the combination of the writing pattern elements with the same hatch corresponds to one fixed pattern 71a, 71b or 71c. In the computer 4, each of the remaining writing pattern elements (i.e., the division target pattern elements) after extraction of the fixed patterns 71a to 71c from the writing pattern 61 is divided into a plurality of rectangle pattern elements by a predetermined technique as indicated by broken lines in FIG. 10, and pattern element writing data to be used for a pattern writing is generated. Then, in the pattern writing apparatus 1, a pattern is written on the substrate 9 on the basis of the pattern element writing data.

As discussed above, in the computer 4, a plurality of key pattern elements which coincide with any of a plurality of fixed pattern elements included in a fixed pattern are specified from a plurality of writing pattern elements, and in a setting area, a predetermined value is added to a position designated by a reverse vector of a position vector of the corresponding fixed pattern element with each key pattern element as a starting point. Then, by specifying the position to which the value coincident with the number of fixed pattern elements included in the fixed pattern is given, the combination of writing pattern elements which contribute to the addition of values to this position are thereby extracted as a fixed pattern. It is thereby possible in the computer 4 to easily extract a fixed pattern from a writing pattern at high speed without performing enormous volume of processing such as detection of all the combinations of writing pattern elements in the writing pattern to be compared with the fixed pattern, or the like.

Figure 11:
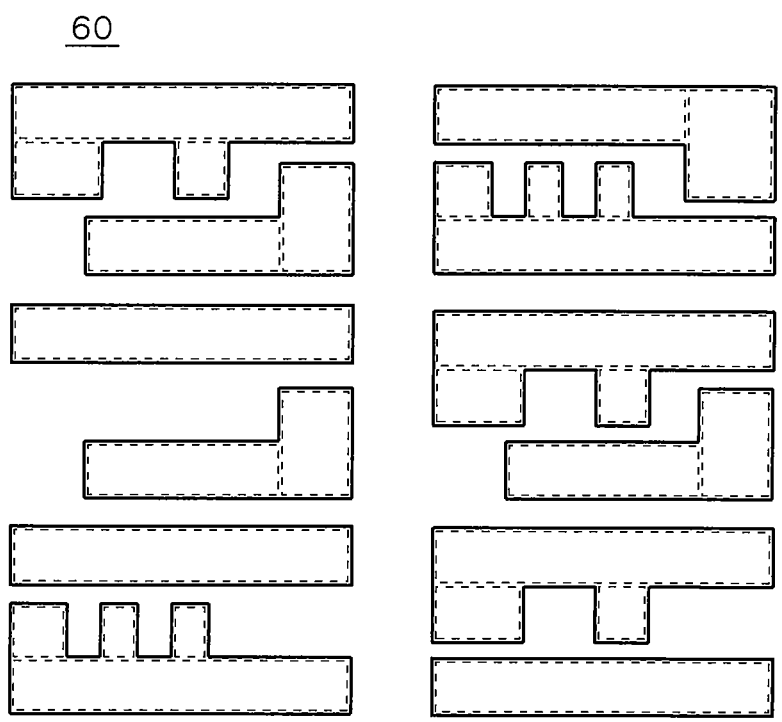
FIG. 11 is a view showing a result of division of all writing pattern elements included in the writing pattern.

In a case where all the writing pattern elements included in the writing pattern 60 of FIG. 4 are divided into rectangle pattern elements, since a lot of rectangle pattern elements are extracted as indicated by broken lines in FIG. 11, it takes a long time to perform writing of the writing pattern. In contrast to this case, in the pattern writing apparatus 1, since the computer 4 extracts the fixed patterns 70 each including a plurality of writing pattern elements from the writing pattern 60 of FIG. 4 and the writing operation using the opening patterns of the mask part 221 is performed for each fixed pattern 70, it is possible to perform writing of writing pattern on the substrate 9 for a short time.

Figure 12:
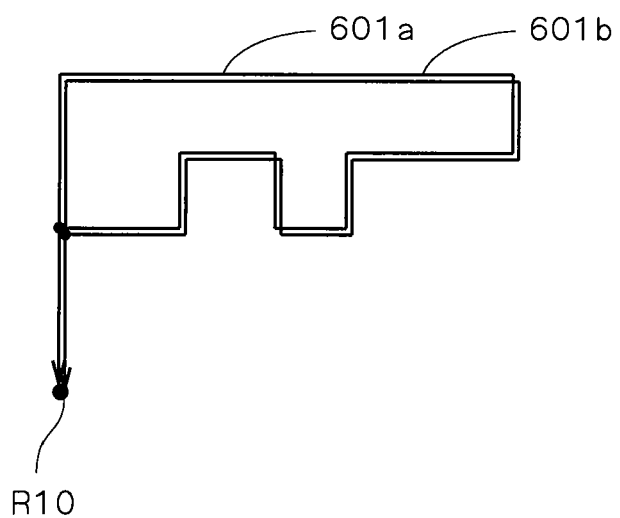
FIG. 12 is a view showing a writing pattern.

Depending on the data structure of a writing pattern, however, a plurality of writing pattern elements of the same shape are overlappingly arranged at the same positions. FIG. 12 is a view showing part of a writing pattern, where two writing pattern elements 601a and 601b of the same shape which are overlappingly arranged are illustrated with one slightly shifted from the other. As shown in FIG. 12, if the writing pattern elements 601a and 601b of the same shape are arranged overlappingly at the same position, when the writing pattern elements 601a and 601b are specified as key pattern elements for, for example, the fixed pattern 71a of FIG. 6A, a value is added to the same position (a position which corresponds to the position represented by reference sign R10 of FIG. 12) in the setting area on the basis of each of these two specified writing pattern elements 601a and 601b and the position R10 of FIG. 12 is therefore wrongly detected as an existing position of the fixed pattern 71a. For this reason, in the pattern element specifying part 51, a reference position of the writing pattern element in the writing pattern which is selected as a target writing pattern element is recorded in a list which is prepared for each fixed shape. With this operation, even if there are a plurality of writing pattern elements in the writing pattern which have the same fixed shape and the same reference position, only either one of these writing pattern elements is selected as a target writing pattern element with reference to the corresponding list in the pattern element specifying part 51, and wrong detection of fixed pattern is thereby prevented.

Next, another exemplary operation of the pattern element specifying part 51 for specifying a key pattern element from a plurality of writing pattern elements in a writing pattern will be discussed in accordance with the operation flow of FIG. 5. FIG. 13 is a view showing a writing pattern 62, illustrating a plurality of writing pattern elements 621a, 621b, 621c and 621d. FIG. 14 is a view showing a fixed pattern 72.

In this exemplary operation, for each of a plurality of fixed pattern elements in the fixed pattern, a plurality of vertices which exist in sequence along desired characteristic portions among its polygonal-line contour are each determined as a feature vertex in advance. In a fixed pattern element 721a included in the fixed pattern 72 of FIG. 14, for example, vertices indicated by points with reference sign T1 are each determined as a feature vertex, and in a fixed pattern element 721b, vertices indicated by points with reference sign T2 are each determined as a feature vertex. In the fixed pattern 72 of FIG. 14, the respective vertices of the fixed pattern elements 721a and 721b which do not overlap the circumscribed rectangle (indicated by a broken line in FIG. 14) of the fixed pattern 72 are each determined as a feature vertex. Further, in this exemplary operation, out of a plurality of feature vertices T1 and T2, the lower and leftmost feature vertices T1a and T2a, respectively, are determined as reference vertices, and the positions of the fixed pattern elements 721a and 721b in the fixed pattern 72 are indicated by position vectors V41 and V42 of the reference vertices T1a and T2a, respectively, with respect to a predetermined reference position P0 (the lower-left vertex of the circumscribed rectangle of the fixed pattern 72 in FIG. 14) in the fixed pattern 72. In the fixed pattern elements 721a and 721b, the reference vertices may be other feature vertices T1 and T2.

In the pattern element specifying part 51, when one writing pattern element 621a in FIG. 13 is selected as a target writing pattern element in Step S13 of FIG. 5, the respective positions of its vertices are sequentially obtained in a counterclockwise direction along its polygonal-line contour with the lower-left reference vertex P2 of the target writing pattern element 621a as a point of origin. Subsequently, out of a plurality of fixed shapes of fixed pattern elements, a fixed shape having vertices as many as the vertices of the target writing pattern element 621a (the number of vertices is ten) is selected (hereinafter, the fixed shape is referred to as "selected fixed shape"), and a fixed pattern including a fixed pattern element having the same shape as the selected fixed shape is specified. In this case, a fixed shape having the same shape as the fixed pattern element 721a in FIG. 14 is selected as a selected fixed shape, and the fixed pattern 72 of FIG. 14 is specified as a fixed pattern including this selected fixed shape. In the following discussion, only one fixed pattern 72 is specified for the selected fixed shape.

With respect to the selected fixed shape, the respective positions of its vertices existing in sequence along its polygonal-line contour are sequentially obtained in a counterclockwise direction with a point which corresponds to the reference vertex T1a as a point of origin with reference to the fixed pattern information. Then, out of the respective positions of all the vertices in the order of acquisition, the respective positions of the vertices which correspond to the feature vertices T1 in the fixed pattern element 721a are individually compared with the corresponding positions of the vertices which are obtained in the target writing pattern element 621a in the same order.

In the pattern element specifying part 51, when it is confirmed that the respective positions of the feature vertices T1 in the selected fixed shape which are obtained with (a vertex which corresponds to) the reference vertex T1a as a point of origin is different from the corresponding positions of the vertices of the target writing pattern element 621a which are obtained with the reference vertex P2 as a point of origin in the same order of acquisition, subsequently, the respective positions of a plurality of vertices of the target writing pattern element 621a are sequentially obtained with a vertex P2a next to the reference vertex P2 in a counterclockwise direction on the contour of the target writing pattern element 621a and compared with the corresponding positions of a plurality of feature vertices T1 in the selected fixed shape. Then, it is confirmed that the respective positions of the feature vertices T1 in the selected fixed shape coincide with the corresponding positions of the vertices in the target writing pattern element 621a in the same order of acquisition with the vertex P2 as a point of origin, and the target writing pattern element 621a is determined as a candidate pattern element and a plurality of vertices in the target writing pattern element 621a which correspond to the plurality of feature vertices T1 in the fixed pattern element 721a are specified. Thus, since it is confirmed that the target writing pattern element 621a has the plurality of vertices which have the same relative positional relation as the plurality of feature vertices T1 in the fixed pattern element 721a and exist in sequence along its polygonal-line contour, the target writing pattern element 621a is specified as the candidate pattern element.

In this case, since in the selected fixed shape and the target writing pattern element 621a, the respective positions of their vertices are obtained with the corresponding vertices (i.e., the reference vertex T1a of the selected fixed shape and the vertex P2a of the target writing pattern element 621a) as their points of origin, it can be considered that the selected fixed shape and the target writing pattern element 621a are overlapped so that the respective positions of the feature vertices T1 of the selected fixed shape and the respective positions of the corresponding vertices of the target writing pattern element 621a should be met. In the pattern element specifying part 51, on the basis of the respective positions of the vertices in each of the selected fixed shape and the target writing pattern element 621a, it is checked if the vertices in the selected fixed shape other than the feature vertices T1 are positioned on the target writing pattern element 621a (in other words, the vertices are included inside or on the contour of the target writing pattern element 621a).

Since the position of the selected fixed shape with respect to the target writing pattern element 621a is actually such as indicated by the broken line of FIG. 13, in the pattern element specifying part 51, it is confirmed that the vertices of the selected fixed shape other than the feature vertices T1 are positioned on the target writing pattern element 621a. Therefore, since it is determined that the target writing pattern element 621a includes this selected fixed shape (Step S14), the target writing pattern element 621a which is a candidate pattern element is specified as a key pattern element for the fixed pattern 72 (Step S15). In other words, the target writing pattern element 621a is specified as a key pattern element for a fixed pattern when the target writing pattern element 621a coincides with or includes any one of a plurality of fixed pattern elements included in this fixed pattern.

If there is no selected fixed shape for a target writing pattern element, the target writing pattern element does not have a plurality of vertices which have the same relative positional relation as a plurality of feature vertices T1 in a selected fixed shape and exist in sequence along its polygonal-line contour, or the vertices of the selected fixed shape other than the feature vertices T1 are not positioned on the target writing pattern element when the selected fixed shape and the target writing pattern element are overlapped, it is determined that the target writing pattern element can not include any fixed pattern element (Step S14), and the process goes to Step S17.

In the operation of the pattern element specifying part 51 discussed before the discussion of this exemplary operation, when the respective positions of the vertices of the target writing pattern element are obtained, by fixing the point of origin to a lower-left vertex and specifying only the target writing pattern element coincident with any one of the fixed pattern elements as a key pattern element, speedup of the operation in the pattern element specifying part 51 is ensured, but in this exemplary operation, since not only the target writing pattern element coincident with any one of the fixed pattern elements but also the target writing pattern element which has a plurality of vertices in sequence having the same relative positional relation as a plurality of feature vertices of any one of the fixed pattern elements and can include the whole fixed pattern element is specified as a key pattern element and the target writing pattern element is therefore compared with the fixed shape while the vertex used as a point of origin in obtaining the respective positions of the vertices of the target writing pattern element is sequentially changed. Therefore, the operation for specifying a key pattern element in this example is considered as a generalized one of the above-discussed operations performed in the pattern element specifying part 51.

After the key pattern element is specified by the pattern element specifying part 51, in the accumulator 52, a value of "1" is added to a position designated by a reverse vector of the position vector V41 of the fixed pattern element 721a with the vertex P2a as a starting point, which is a vertex corresponding to the reference vertex T1a of the target writing pattern element 621a which is the key pattern element, in the setting area for the fixed pattern 72 (Step S116). In FIG. 13, for easy understanding, a reverse vector Vr41 of the position vector V41 (and the reverse vector Vr42 discussed later) is indicated by broken-line arrow, on the writing pattern 62.

After that, the writing pattern element 621b is selected as a target writing pattern element (Steps S17 and S13), and like in the above operation, the fixed shape of the fixed pattern element 721b is selected as a selected fixed shape by comparing the fixed shape with the target writing pattern element in the number of vertices, and the fixed pattern 72 of FIG. 14 including a fixed pattern element having the same shape as the selected fixed shape is specified. Subsequently, it is confirmed that the respective positions of the feature vertices T2 with (a vertex corresponding to) the reference vertex T2a of the selected fixed shape as a point of origin coincide with the corresponding positions of the vertices of the target writing pattern element 621b in the same order with a vertex represented by reference sign P2b of FIG. 13 as a point of origin and the target writing pattern element 621b is specified as a candidate pattern element. Then, in a state where the selected fixed shape and the target writing pattern element 621b are overlapped so that the feature vertices T2 of the selected fixed shape and the corresponding vertices of the target writing pattern element 621b should be met, since it is confirmed that the vertices of the selected fixed shape other than the feature vertices T2 are positioned on the target writing pattern element 621b, it is determined that the target writing pattern element 621b includes this selected fixed shape (Step S14) and the target writing pattern element 621b which is the candidate pattern element is specified as a key pattern element for the fixed pattern 72 (Step S15). In the accumulator 52, a value of "1" is added to a position designated by a reverse vector Vr42 of the position vector V42 of the fixed pattern element 721b with the vertex P2b of the target writing pattern element 621b as a starting point in the setting area of the fixed pattern 72 (Step S116).

In the processing part 5, the above operations of Steps S13 to S16 are repeated for the other writing pattern elements 621c and 621d included in the writing pattern 62 (Step S17). With the repeating operations, the writing pattern elements 621c and 621d are also each specified as a writing pattern element for the fixed pattern 72 and a value of "1" is added to a position designated by the reverse vector Vr41 of the position vector V41 of the fixed pattern element 721a with a vertex P2c of the writing pattern element 621c as a starting point and a position designated by the reverse vector Vr42 of the position vector V42 of the fixed pattern element 721b with a vertex P2d of the writing pattern element 621d as a starting point in the setting area for the fixed pattern 72. Then, by specifying the position in the setting area to which a value of "2" which corresponds to the number of fixed pattern elements 721a and 721b is given, the existing position of the fixed pattern 72 in the writing pattern 62 is detected (Step S18). The fixed pattern 72 is thereby quickly extracted from the writing pattern 62. Though only one fixed pattern 72 is specified for the selected fixed shape in the above discussion, in a case where a plurality of fixed patterns are specified for the selected fixed shape, the following operations in the pattern element specifying part 51 are performed in consideration of the positions of the corresponding feature vertices for each fixed pattern.

FIG. 15 is a view showing a result of extraction of the fixed pattern 72 from the writing pattern 62 of FIG. 13. In FIG. 15, the combination of writing pattern elements with the same hatch corresponds to one fixed pattern 72. In the computer 4, each of the remaining pattern elements after the extraction of the fixed pattern 72 from the writing pattern 62 is determined as a division target pattern element and in this case, each division target pattern element is a rectangle pattern element after division without dividing operation. Then, pattern element writing data to be used for a pattern writing is generated and a pattern is written on the substrate 9 on the basis of the pattern element writing data.

As discussed above, in the pattern element specifying part 51 of this operation example, for each fixed pattern element included in a fixed pattern, a plurality of feature vertices defining characteristic portions of its contour are determined in advance and a candidate pattern element having a plurality of vertices which have the same relative positional relation as a plurality of feature vertices in any one fixed pattern element and exist in sequence along its polygonal-line contour is specified from a plurality of writing pattern elements in a writing pattern. Then, when the plurality of feature vertices in this fixed pattern element and the plurality of corresponding vertices in the candidate pattern element are overlapped, if remaining other vertices in the fixed pattern element are positioned on the candidate pattern element, this candidate pattern element is specified as a key pattern element. With this operation, even if the writing pattern element has a shape different from that of the fixed pattern element, a pattern element which has characteristic portions of contour of the fixed pattern element as part of its contour and can include the fixed pattern element can be appropriately specified as a key pattern element out of the plurality of writing pattern elements, and this makes it possible to perform high-level extraction of fixed pattern(s) from the writing pattern. Though selection of the selected fixed shape is performed with reference to the number of vertices in order to reduce the volume of computation in specifying the key pattern element in this exemplary operation, the selection of the selected fixed shape may be omitted, depending on the computation speed of the computer 4. Also in the pattern element specifying part 51 of the second preferred embodiment discussed later, the above operation may be adopted.

FIG. 16 is a view showing a fixed pattern 73. In a fixed pattern element 731a included in the fixed pattern 73 of FIG. 16, vertices indicated by points with reference sign T3 are each determined as a feature vertex, and in a fixed pattern element 731b, vertices indicated by points with reference sign T4 are each determined as a feature vertex.

In a case where the fixed pattern 73 of FIG. 16 is prepared, and a writing pattern 63 including writing pattern elements 631a and 631b of FIG. 17 is inputted to the computer 4, a hatched area in FIG. 17 is extracted as the fixed pattern 73 by the above operation in consideration of the feature vertices. Thus, by the above operation, even if there is a combination of writing pattern elements in the writing pattern 63 where areas are attached to upper, lower, left and/or right sides of the fixed pattern 73, it is possible to extract the fixed pattern 73 from the writing pattern 63. In the writing pattern 63 of FIG. 17, each of the remaining pattern elements after extraction of the fixed pattern 73 is determined as a division target pattern element and the division target pattern element is divided into a plurality of rectangle pattern elements as indicated by broken lines in FIG. 17.

Figure 19:
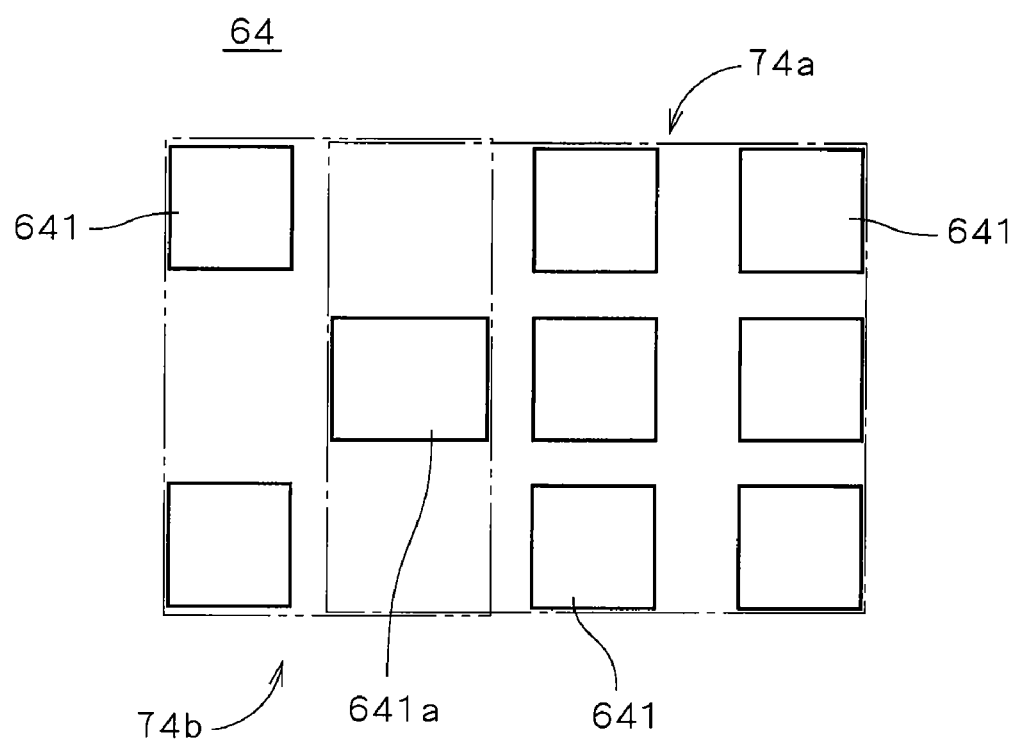
FIG. 19 is a view showing a writing pattern.

Next, discussion will be made on a case where two fixed patterns whose existing positions in the writing pattern are detected overlap each other. In a case, for example, where a fixed pattern 74a shown in FIG. 18A and a fixed pattern 74b shown in FIG. 18B are prepared, when a writing pattern 64 shown in FIG. 19 is inputted, the position detecting part 53 detects respective existing positions of the fixed patterns 74a and 74b in the writing pattern 64. In this case, in the writing pattern 64, part of areas of a plurality of fixed pattern elements included in the fixed pattern 74*a* (areas occupied by writing pattern elements 641 included in an area surrounded by a one-dot chain line in FIG. 19, and hereinafter, referred to as "existing areas") and part of an existing area of the fixed pattern 74*b* (an area occupied by the writing pattern elements 641 included in an area surrounded by a two-dot chain line in FIG. 19) are overlapped. In this case, when each of the fixed patterns 74*a* and 74*b* are written by the pattern writing apparatus 1, irradiation of electron beam is overlappingly performed for an area on the substrate 9 which corresponds to a writing pattern element 641*a* of FIG. 19 (i.e., multiple exposure) and for this reason, this is not a preferable pattern writing.

Then, in the position detecting part 53, with reference to an evaluation value prepared in advance for each of the fixed patterns 74*a* and 74*b*, one fixed pattern to be extracted from the writing pattern 64 is selected. Herein, discussion will be made on an evaluation value prepared for extraction of fixed pattern. In the fixed pattern 74*a* of FIG. 18A, for example, assuming that each of seven fixed pattern elements is divided into rectangle pattern elements, since each fixed pattern element is regarded as one rectangle pattern element, the division number in dividing the fixed pattern 74*a* into rectangle pattern elements is seven. Though the division number of the fixed pattern 74*a* is equal to the number of fixed pattern elements since all the fixed pattern elements in the fixed pattern 74*a* are rectangles, in a case of a fixed pattern including fixed pattern elements having a shape other than rectangle, the division number is larger than the number of fixed pattern elements. Further, assuming that the fixed pattern 74*a* is written on the substrate 9, since an opening pattern corresponding to the fixed pattern 74*a* is larger than an area on the mask part 221 of FIG. 1 to which an electron beam is emitted from the beam emission part 21, the electron beam is emitted to an area on the mask part 221 which corresponds to an area represented by reference sign K1 in FIG. 18A to write fixed pattern elements included in this area K1 on the substrate 9 and subsequently an irradiation position of the electron beam on the mask part 221 is changed to a position which corresponds to the center of an area represented by reference sign K2 in FIG. 18A to write fixed pattern elements included in the area K2 on the substrate 9. In other words, in the pattern writing apparatus 1, two writing operations are performed for writing the fixed pattern 74*a*. Therefore, in the computer 4, a value of "5" obtained by subtracting the number of writing operations for writing the fixed pattern 74*a*, i.e., "2", from the division number of the fixed pattern 74*a*, i.e., "7", is prepared in advance as an evaluation value for the fixed pattern 74*a*. In the fixed pattern 74*b* of FIG. 18B, since the division number in dividing this fixed pattern into rectangle pattern elements is "3" and the number of writing operations for writing the fixed pattern 74*b* is "1", its evaluation value is "2".

In the position detecting part 53, the respective evaluation values prepared in advance for these two fixed patterns 74*a* and 74*b* are compared with each other and only the fixed pattern 74*a* having a larger evaluation value is extracted from the writing pattern. With this operation, even if the existing areas of the fixed patterns 74*a* and 74*b* overlap each other, it is possible to achieve extraction of a preferable fixed pattern (with less number of writing operations) from the writing pattern.

In the writing pattern 64 of FIG. 19, some fixed pattern elements included in the fixed pattern 74*a* and some fixed pattern elements included in the fixed pattern 74*b* overlap each other. The selection of preferable fixed pattern using an evaluation value may be performed in a case where some fixed pattern elements included in one fixed pattern and some fixed pattern elements included in another fixed pattern partially overlap, a case where all the fixed pattern elements in one fixed pattern and some fixed pattern elements in another fixed pattern overlap each other, or the like. In other words, in the computer 4, in a case where at least part of an existing area of one fixed pattern in a writing pattern and at least part of an existing area of another fixed pattern overlap each other, an evaluation value obtained by subtracting the number of writing operations for writing one fixed pattern from the division number in dividing this fixed pattern into rectangle pattern elements is compared with an evaluation value obtained by the number of writing operations for writing another fixed pattern from the division number in dividing this fixed pattern into rectangle pattern elements and only either one of these two fixed patterns, for which a larger evaluation value is obtained, is extracted from the writing pattern. In a second position detecting part 53*b* of the second preferred embodiment discussed later, the above operation may be performed.

Figure 20:
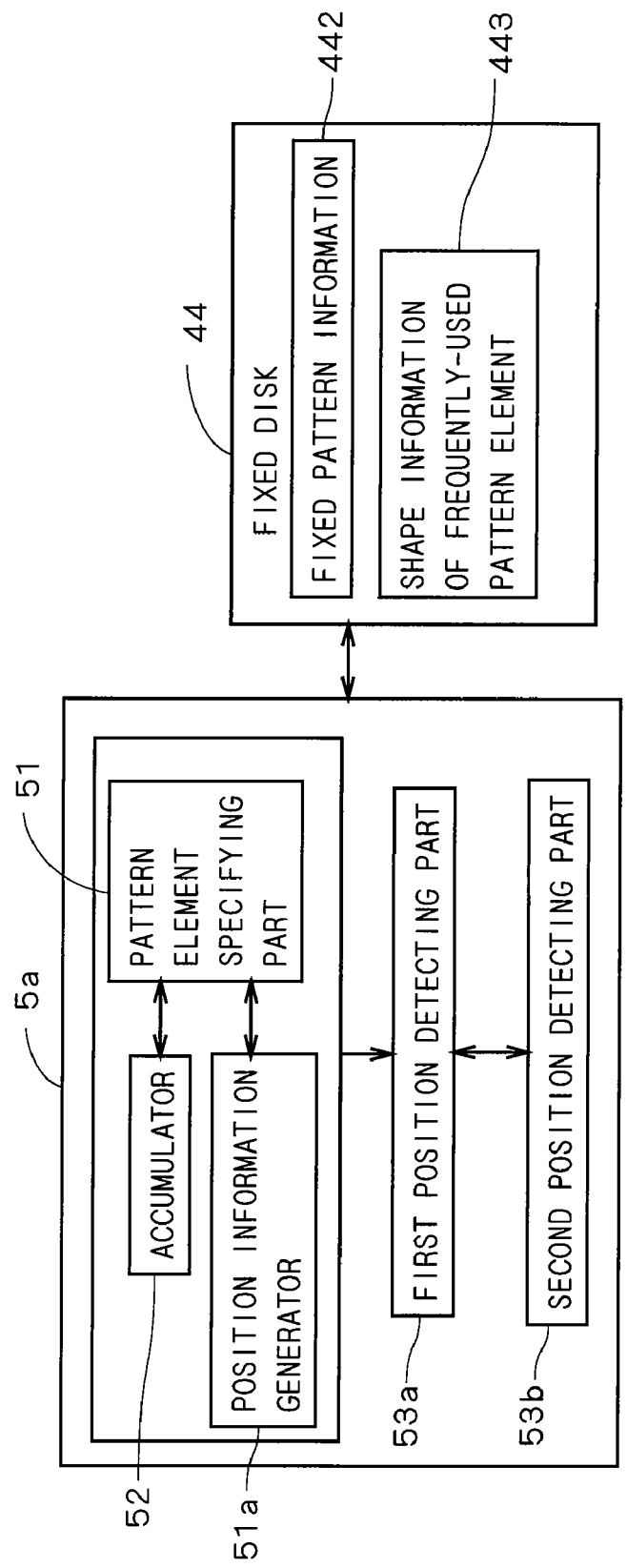
FIG. 20 is a block diagram showing a structure of functions implemented by the computer in accordance with a second preferred embodiment.
Figure 21A:
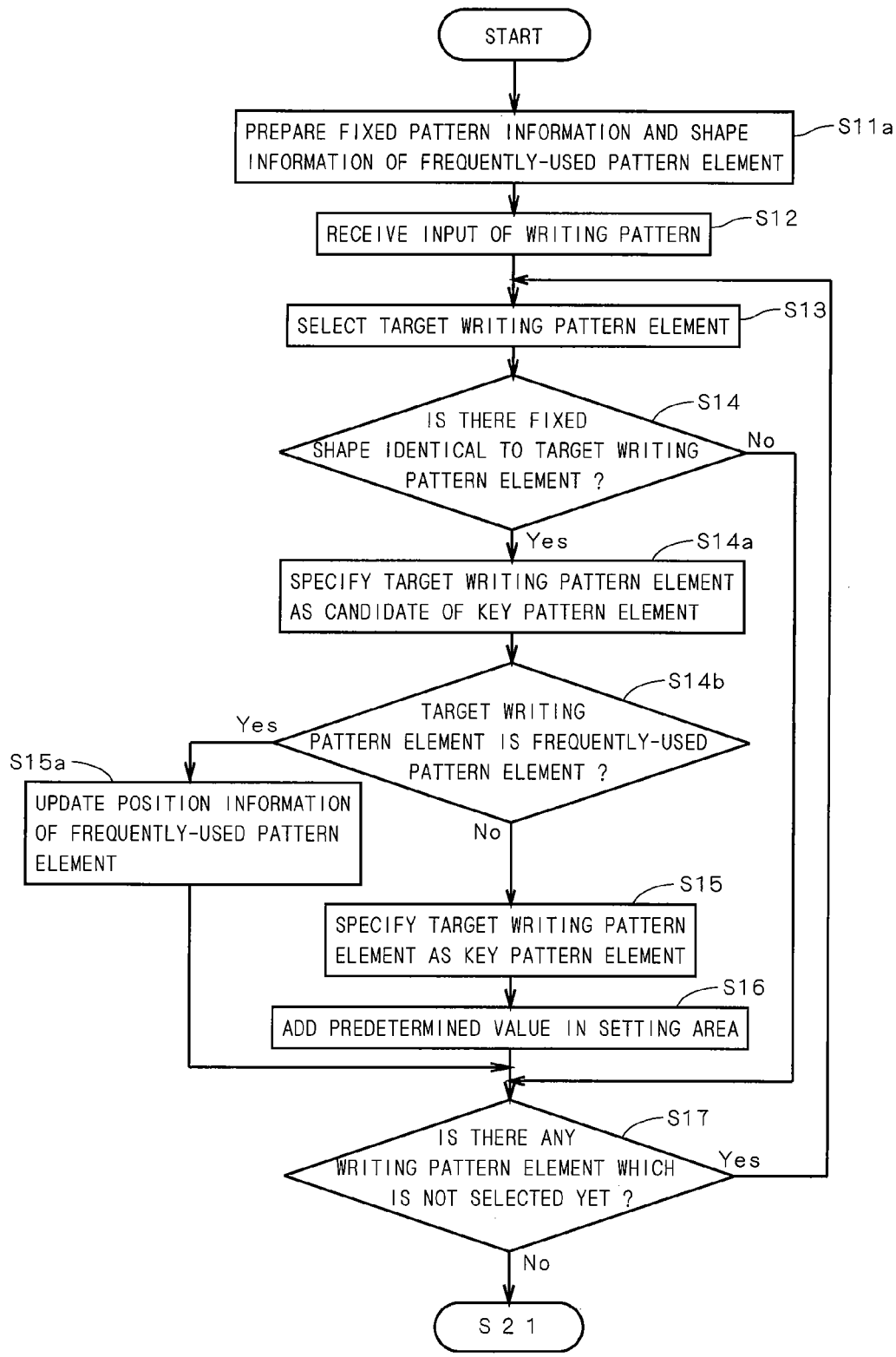
FIGS. 21A and 21B are flowcharts each showing an operation flow for extracting a fixed pattern from a writing pattern.
Figure 21B:
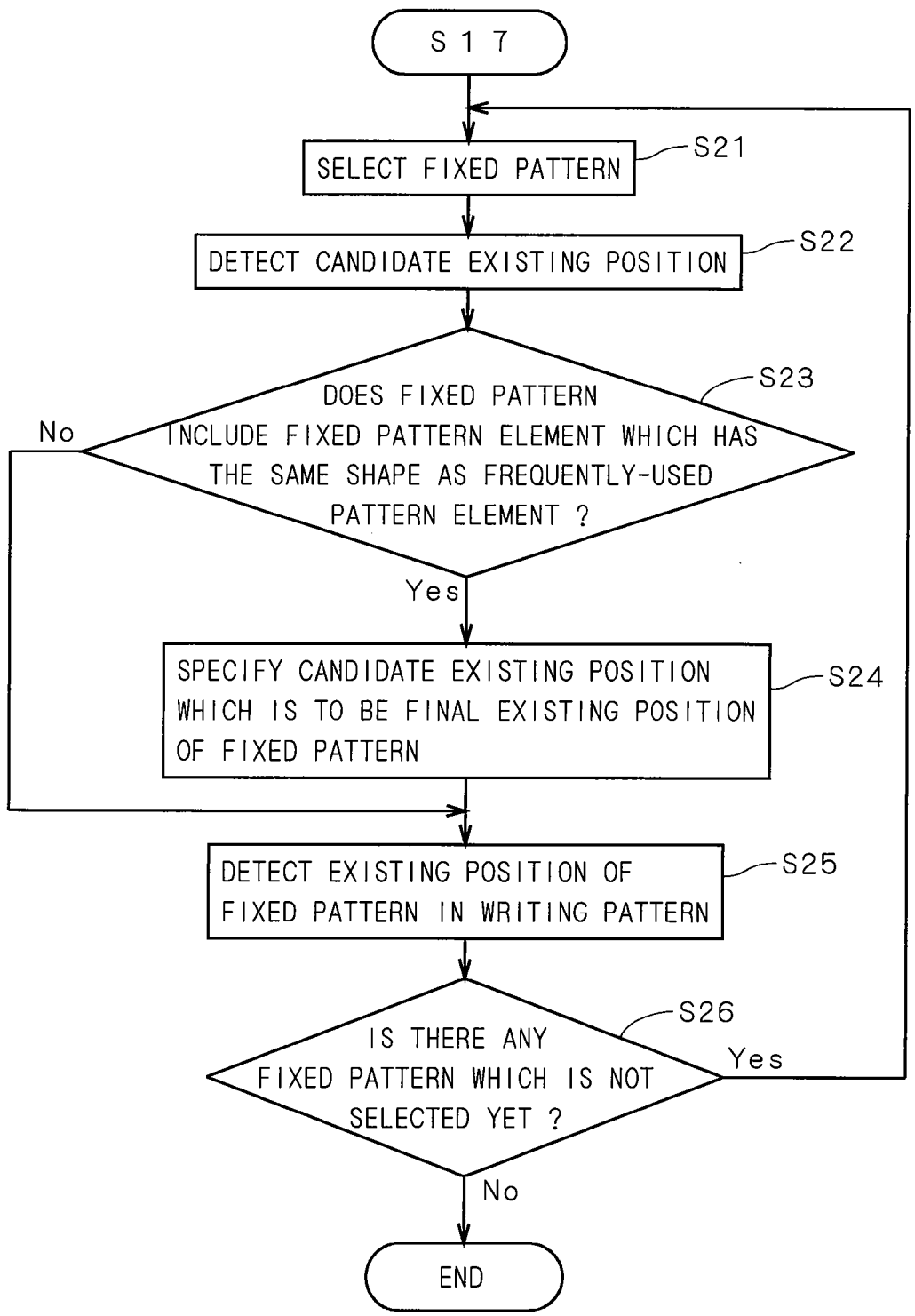

Next, the second preferred embodiment of the present invention will be discussed. FIG. 20 is a block diagram showing a structure of functions implemented by executing a program in the computer 4 in accordance with the second preferred embodiment. FIG. 20 shows the functions of a processing part 5*a* (the pattern element specifying part 51, a position information generator 51*a*, the accumulator 52, a first position detecting part 53*a* and a second position detecting part 53*b*) implemented by the CPU 41 and the like. FIGS. 21A and 21B are flowcharts each showing an operation flow of the computer 4 for extracting a fixed pattern from a writing pattern.

Figure 22:
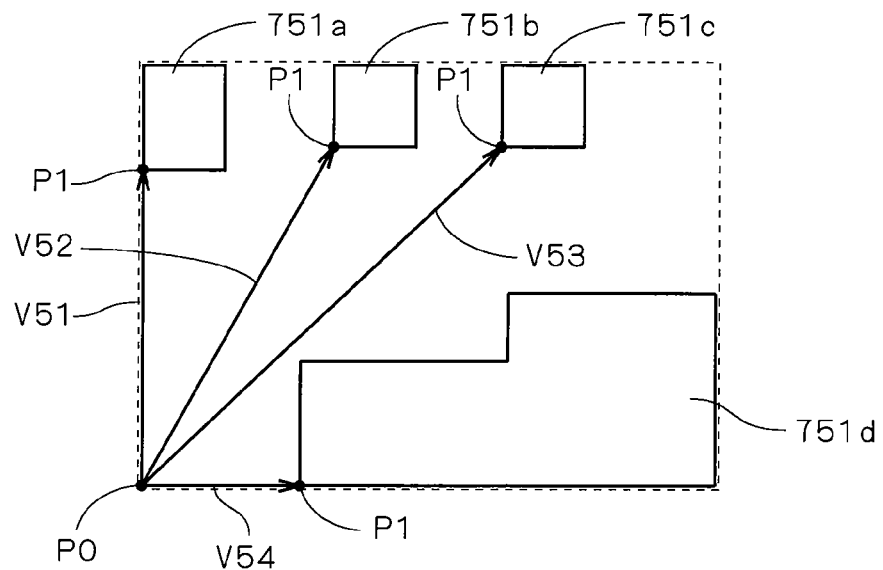
FIG. 22 is a view showing a fixed pattern.

In the computer 4, first, like in the first preferred embodiment, the fixed pattern information 442 indicating respective shapes of a plurality of fixed pattern elements included in each fixed pattern and respective position vectors of the fixed pattern elements with respect to a predetermined reference position in the fixed pattern. FIG. 22 is a view showing a fixed pattern 75. Actually, the fixed pattern 75 is represented by combinations of the respective kinds of fixed shapes of fixed pattern elements 751*a* to 751*d* and position vectors V51, V52, V53 and V54 of the respective lower-left reference vertices (vertices represented by reference sign P1 in FIG. 22) of the fixed pattern elements 751*a* to 751*d* with respect to a reference position P0 in the fixed pattern 75 (the lower-left vertex of the circumscribed rectangle of the fixed pattern 75 indicated by the broken lie in FIG. 22).

Figure 23:
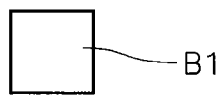
FIG. 23 is a view showing a shape of a frequently-used pattern element.

Further, shape information of frequently-used pattern element 443 indicating the shape (hereinafter, referred to as "frequently-used shape") of a predetermined pattern element (hereinafter, referred to as "frequently-used pattern element") which is frequently used in a plurality of writing pattern elements in the writing pattern (i.e., a plurality of frequently-used pattern elements, each of which has frequently-used shape, exist in the writing pattern.) discussed later is also inputted to the computer 4 and stored in the fixed disk 44, being thus prepared (Step S11*a*). In the present preferred embodiment, a frequently-used shape B1 shown in FIG. 23 is prepared as one indicating a frequently-used pattern element.

After the fixed pattern information 442 and the shape information of frequently-used pattern element 443 are prepared, data of a writing pattern is inputted to the computer 4 and stored in the fixed disk 44 (Step S12), and the writing pattern is outputted from the fixed disk 44 to the processing part 5.

Figure 24:
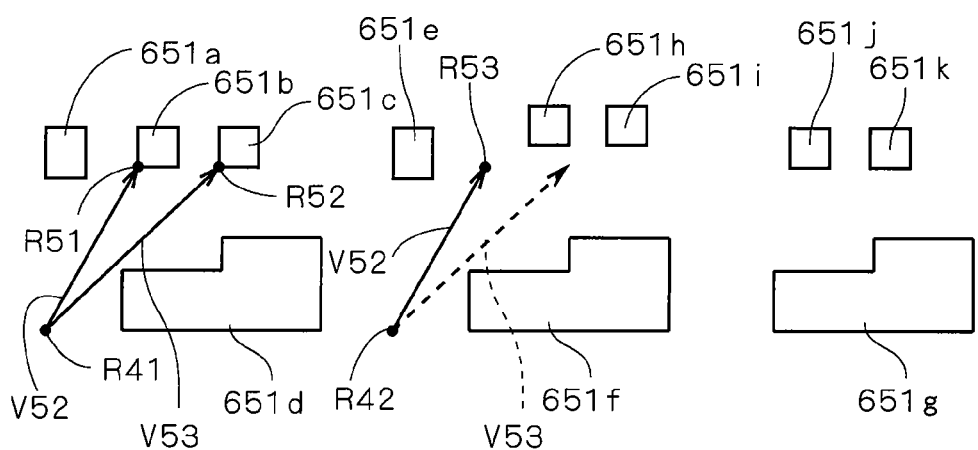
FIG. 24 is a view showing a writing pattern.

FIG. 24 is a view showing a writing pattern 65. In the pattern element specifying part 51, a writing pattern element represented by reference sign 651*a* in the writing pattern 65 of FIG. 24 is selected as a target writing pattern element (Step S13). Like in the first preferred embodiment, the target writing pattern element 651a is compared with each of fixed shapes of the fixed pattern elements and it is checked if the target writing pattern element 651a coincides with any one of the fixed shapes. Since the target writing pattern element 651a is actually equal to the fixed shape of the fixed pattern element 751a in the fixed pattern 75 (Step S14), the target writing pattern element 651a is specified as a candidate of a key pattern element (Step S14a).

Subsequently, the target writing pattern element 651a is compared with the frequently-used shape B1 indicating the frequently-used pattern element, and it is thereby confirmed that the target writing pattern element 651a does not have the same shape as the frequently-used shape B1 (in other words, the target writing pattern element 651a is not one of frequently-used pattern elements) (Step S14b) and the target writing pattern element 651a is specified as a key pattern element (Step S15). Thus, if the target writing pattern element 651a coincides with any one of the fixed pattern elements (hereinafter, referred to as "selected fixed pattern element") other than ones having the same shape (i.e., the frequently-used shape) as the frequently-used pattern element among the plurality of fixed pattern elements 751a to 751d, the target writing pattern element 651a is specified as a key pattern element. In the fixed pattern 75 of FIG. 22, since only the fixed pattern elements 751b and 751c have the same shape as the frequently-used shape B1, the fixed pattern elements 751a and 751d are selected fixed pattern elements. In the pattern element specifying part 51, by specifying a fixed shape different from the shape of the frequently-used pattern element out of a plurality of kinds of fixed shapes of fixed pattern elements in advance, while a fixed shape which coincides with the target writing pattern element 651a is specified, the target writing pattern element 651a may be specified as a key pattern element.

In the accumulator 52, in the setting area for the fixed pattern 75 shown in FIG. 25, a value of "1" is added to a position R41 designated by a reverse vector Vr51 of the position vector V51 of the corresponding fixed pattern element 751a with the lower-left reference vertex P2 of the target writing pattern element 651a as a starting point (Step S16).

After the addition of value is performed in the setting area, in the pattern element specifying part 51, it is checked if there is any writing pattern element which is not selected yet in the writing pattern 65. In this case, since there is a writing pattern element which is not selected yet (Step S17), the writing pattern element represented by reference sign 651b in the writing pattern 65 of FIG. 24 is selected as a next target writing pattern element (Step S13). Subsequently, it is confirmed that the target writing pattern element 651b coincides with any one of the fixed shapes of the fixed pattern elements (Step S14), and the target writing pattern element 651b is specified as a candidate of a key pattern element (Step S14a). Then, the target writing pattern element 651b is compared with the frequently-used shape B1 indicating the frequently-used pattern element, and if it is thereby confirmed that the target writing pattern element 651b has the same shape as the frequently-used shape B1 (in other words, the target writing pattern element 651b is a frequently-used pattern element) (Step S14b), a position of the lower-left reference vertex of the target writing pattern element 651b in the writing pattern 65 is stored in the position information generator 51a as position information of frequently-used pattern element (Step S15a). In the position information generator 51a, new position information of frequently-used pattern element is generated for a first target writing pattern element which is a frequently-used pattern element, and the position information of frequently-used pattern element is updated for the following target writing pattern element which is specified as a frequently-used pattern element after that, by adding a position of the target writing pattern element to the position information of frequently-used pattern element as discussed later.

Subsequently, a writing pattern element represented by reference sign 651c in the writing pattern 65 is selected as a next target writing pattern element (Steps S17 and S13), it is confirmed that the target writing pattern element 651c coincides with any one of the fixed shapes, and the target writing pattern element 651c is specified as a candidate of a key pattern element (Steps S14 and S14a). Then, it is confirmed that the target writing pattern element 651c has the same shape as the frequently-used shape B1 indicating the frequently-used pattern element (Step S14b), and the position information of frequently-used pattern element which is stored in the position information generator 51a is updated by adding a position of the lower-left reference vertex of the target writing pattern element 651c in the writing pattern 65 to the position information of frequently-used pattern element (Step S15a). If the target writing pattern element does not coincide with any fixed shape (Step S14), a next target writing pattern element is selected in the writing pattern 65 (Steps S17 and S13).

Thus, in the processing part 5a, the above operations are repeated for all the writing pattern elements included in the writing pattern 65 (Step S17). With the repeating operations, in the pattern element specifying part 51, with reference to the fixed pattern information 442 and the shape information of frequently-used pattern element 443, a plurality of key pattern elements each of which coincides with any one of the selected fixed pattern elements 751a and 751b included in the fixed pattern 75 are specified from the plurality of writing pattern elements in the writing pattern 65, and in the accumulator 52, in the setting area for the fixed pattern 75, a predetermined value is added to a position designated by a reverse vector of the position vector of the corresponding fixed pattern element with each of a plurality of key pattern elements as a starting point. In the position information generator 51a generated is final position information of frequently-used pattern element indicating positions of the frequently-used pattern elements in the writing pattern 65, which are specified from the plurality of writing pattern elements.

In the setting area of FIG. 25, besides the position R41 designated by the reverse vector Vr51 with the above-discussed writing pattern element 651a as a starting point, the position R41 designated by a reverse vector Vr54 with a writing pattern element 651d as a starting point, a position R42 designated by the reverse vector Vr51 with a writing pattern element 651e as a starting point, the position R42 designated by the reverse vector Vr54 with a writing pattern element 651f as a starting point, and a position R43 designated by the reverse vector Vr54 with a writing pattern element 651g as a starting point are specified and the value of "1" is added to each of these positions, and finally, the values of the position R41 and R42 each become "2", the value of the position R43 becomes "1" and the values of other positions each become "0". In the writing pattern 65, besides the writing pattern elements 651b and 651c, writing pattern elements 651h to 651k are also specified as frequently-used pattern elements and positions of the writing pattern elements 651b, 651c and 651h to 651k are stored in the position information of frequently-used pattern element.

Though a plurality of (two) selected fixed pattern elements 751a and 751d exist in the fixed pattern 75 of FIG. 22, there may be a case where only one selected fixed pattern element exists in a fixed pattern only if the fixed pattern includes at least one fixed pattern element having the same shape as the frequently-used pattern element. In other words, in the pattern element specifying part 51, at least one key pattern element is specified from a plurality of writing pattern elements, which coincides with any one of at least one selected fixed pattern element.

Though the above discussion has been made on the case where one fixed pattern 75 is prepared, actually, a plurality of fixed patterns are prepared. Then, with reference to the fixed pattern information and the shape information of frequently-used pattern element, for each of the fixed patterns, a plurality of key pattern elements each of which coincides with any one of selected fixed pattern elements included in this fixed pattern are specified out of a plurality of writing pattern elements in the writing pattern 65, and in the setting area for this fixed pattern, a predetermined value is added to a position designated by a reverse vector of a position vector of the corresponding fixed pattern element with each of the plurality of key pattern elements specified for this fixed pattern as a starting point.

After the additions of corresponding values for all the key pattern elements in the writing pattern 65 are completed in each setting area (Step S17), in the first position detecting part 53*a*, one fixed pattern is selected (Step S21) and a candidate of an existing position (hereinafter, referred to as "candidate existing position") of this fixed pattern in the writing pattern 65 is detected (Step S22). In a case, for example, where the fixed pattern 75 of FIG. 22 is selected, in the setting area for the fixed pattern 75 shown in FIG. 25, the positions R41 and R42 to which a value corresponding to the number of selected fixed pattern elements 751*a* and 751*d* (i.e., "2") included in the fixed pattern 75 is given are specified and the positions R41 and R42 in the writing pattern 65 of FIG. 24 are each detected as a candidate existing position for the fixed pattern 75.

After the candidate existing position for the fixed pattern is detected, in the second position detecting part 53*b*, it is checked if this fixed pattern includes any fixed pattern element having the same shape (frequently-used shape) as the frequently-used pattern element. In the fixed pattern 75 of FIG. 22, it is confirmed that this fixed pattern includes the fixed pattern elements 751*b* and 751*c* having the same shape of the frequently-used pattern element (Step S23), and subsequently on the basis of the position information of frequently-used pattern element, a candidate existing position which is to be a final existing position of the fixed pattern 75 is specified (Step S24).

Specifically, first, one candidate existing position R41 in the writing pattern 65 of FIG. 24 is selected and a position R51 designated by the position vector V52 of one fixed pattern element 751*b* having the same shape as the frequently-used pattern element is calculated with the candidate existing position R41 as a starting point and it is checked if the position R51 is included in the position information of frequently-used pattern element. In this case, since the position R51 is included in the position information of frequently-used pattern element (in other words, the position R51 overlaps a reference vertex of the writing pattern element 651*b* which is one of frequently-used pattern elements), a position R52 designated by the position vector V53 of the other fixed pattern element 751*c* having the same shape as the frequently-used pattern element is subsequently calculated with the candidate existing position R41 as a starting point. Then, it is confirmed that the position R52 is also included in the position information of frequently-used pattern element and the candidate existing position R41 is thereby specified as a position which is to be a final existing position of the fixed pattern 75. In other words, in the second position detecting part 53*b*, since the position information of frequently-used pattern element includes the positions designated by the respective position vectors of all the fixed pattern elements having the same shape as the frequently-used pattern element with the candidate existing position as a starting point, this candidate existing position is specified as a position which is to be a final existing position.

Similarly, with respect to the other candidate existing position R42 in the writing pattern 65 of FIG. 24, a position R53 designated by the position vector V52 of one fixed pattern element 751*b* having the same shape as the frequently-used pattern element is calculated with the candidate existing position R42 as a starting point. Since the position R53 is not included in the position information of frequently-used pattern element (in other words, the position R53 does not overlap the reference vertex of any frequently-used pattern element), it is determined that the candidate existing position R42 does not become a final existing position of the fixed pattern 75. Since it is confirmed that the candidate existing position R42 does not become a final existing position at that point of time when only calculation of the position R53 is finished, no calculation is performed for a position designated by the position vector V53 of the other fixed pattern element 751*c* with the candidate existing position R42 as a starting point (in other words, no calculation is performed for a position designated by the arrow V53 indicated by a broken line in FIG. 24).

In the above operation of the second position detecting part 53*b*, practically, when the fixed pattern 75 is arranged so that the reference position P0 should meet each candidate existing position in the writing pattern 65, if it is confirmed on the basis of the position information of frequently-used pattern element that the frequently-used pattern elements included in the writing pattern 65 exist at the positions of all the fixed pattern elements 751*b* and 751*c* having the same shape as the frequently-used pattern element included in the fixed pattern 75, this candidate existing position is detected as a final existing position of the fixed pattern 75. Then, only the candidate existing position R41 which is to be a final existing position is detected as a final existing position of the fixed pattern 75 (Step S25), and the fixed pattern 75 is extracted from the writing pattern 65.

After the final existing position of the fixed pattern 75 is detected, it is checked if there is any fixed pattern which is not selected yet. If there is a fixed pattern which is not selected yet (Step S26), a next fixed pattern is selected (Step S21) and after the candidate existing position of this fixed pattern is detected (Step S22), it is checked if the fixed pattern includes any fixed pattern element having the same shape as the frequently-used pattern element. Herein, if it is confirmed that the fixed pattern includes no fixed pattern element having the same shape as the frequently-used pattern element (Step S23), the candidate existing position itself is detected as a final existing position of the fixed pattern (Step S25) and the fixed pattern is extracted from the writing pattern 65. In a case where the fixed pattern includes a fixed pattern element having the same shape as the frequently-used pattern element (Step S23), if it is determined that no candidate existing position becomes a final existing position (Step S24), Step S25 is skipped. If there is no position in the setting area to which a value corresponding to the number of fixed pattern elements included in the fixed pattern is given in Step S22 and no candidate existing position is detected, then it is detrmined that this fixed pattern does not exist in the writing pattern, and the process goes to Step S26.

After the above operations Steps of S21 to S25 are repeated for all the fixed patterns (Step S26), the fixed pattern extracting process by the computer 4 is completed.

In a case where the shape information of frequently-used pattern element indicating a plurality of kinds of frequently-used shapes is prepared in Step S11a, a position information of frequently-used pattern element is generated for each frequently-used shape by the position information generator 51a, and in detection of final existing position(s) of fixed pattern(s) by the second position detecting part 53b, it is confirmed if any of frequently-used pattern elements in a writing pattern each having a frequently-used shape exists at a position of each of at least one fixed pattern element each having the frequently-used shape when the fixed pattern is arranged at the candidate existing position in the writing pattern, on the basis of the position information of frequently-used pattern element for the frequently-used shape.

Thus, in the computer 4 of the second preferred embodiment, any writing pattern element which coincides with any one of selected fixed pattern elements having a shape different from the frequently-used pattern element is specified as a key pattern element out of a plurality of writing pattern elements and a value is added to a position in a setting area which is designated by a reverse vector of a position vector of the corresponding selected fixed pattern element with each key pattern element as a starting point. Then, the position in the setting area to which a value coincident with the number of selected fixed pattern elements included in the fixed pattern is given is specified and the candidate existing position for the fixed pattern in the writing pattern is thereby detected, and if there is any writing pattern element whose position and shape are identical to those of each fixed pattern element having the same shape as the frequently-used pattern element when the fixed pattern is disposed at the candidate existing position, the candidate existing position is detected as a final existing position of the fixed pattern.

Herein, assuming that the fixed pattern extracting process of the first preferred embodiment is performed for the writing pattern 65 of FIG. 24, since the fixed pattern 75 of FIG. 22 includes two fixed pattern elements each having the same shape as the frequently-used pattern element and the writing pattern 65 includes six frequently-used pattern elements, the operation of the accumulator 52 for calculating a position in the setting area to which a value is to be added on the basis of each frequently-used pattern element and adding the value to this position is performed twelve times. In contrast to this case, in the present preferred embodiment, none of the frequently-used pattern elements in the writing pattern 65 is regarded as a key pattern element and the second position detecting part 53b calculates the positions designated by the position vectors of those two fixed pattern elements in the fixed pattern 75 each having the same shape as the frequently-used pattern element with the candidate existing position as a starting point, to check if these positions are included in the position information of frequently-used pattern element. Exactly, as discussed above, only three positions R51, R52 and R53 are calculated and it is checked if these three positions are included in the position information of frequently-used pattern element.

Though it is no use making unconditional comparison in volume of operations between the first and second preferred embodiments since the operation of the second position detecting part 53b in the second preferred embodiment is different from the operation of the accumulator 52 in the first preferred embodiment, in a case where a fixed pattern includes m fixed pattern elements having a frequently-used shape and a writing pattern includes n frequently-used pattern elements, the operation of the accumulator 52 in the first preferred embodiment is performed (m×n) times while the operation of the second position detecting part 53b in the second preferred embodiment less times, and the more frequently-used pattern elements the writing pattern includes, the more difference in volume of operations is caused between the accumulator 52 in the first preferred embodiment and the second position detecting part 53b in the second preferred embodiment. Since a pattern to be written on a semiconductor substrate generally includes a lot of frequently-used pattern elements, in comparison between the volume of operations by the accumulator 52 in the first preferred embodiment and that of operations by the second position detecting part 53b in the second preferred embodiment, usually, there is difference in time for operations by double-digit or more. Thus, in the case where a writing pattern includes frequently-used pattern elements, the fixed pattern extracting process of the second preferred embodiment can extract fixed patterns from the writing pattern at higher speed than that of the first preferred embodiment.

Also in the pattern element specifying part 51 of the present preferred embodiment, a key pattern element including any one of selected fixed pattern elements included in a fixed pattern may be specified out of a plurality of writing pattern elements in a writing pattern. Like in the operation discussed with reference to FIGS. 13 and 14, for example, a plurality of feature vertices existing in sequence along a polygonal-line contour of each of selected fixed pattern elements included in the fixed pattern are determined in advance, and a candidate pattern element having a plurality of vertices which have the same relative positional relation as a plurality of feature vertices in any one of the selected fixed pattern elements and exist in sequence along its polygonal-line contour is specified out of the plurality of writing pattern elements in the writing pattern. Then, when the plurality of feature vertices of this selected fixed pattern element and the plurality of corresponding vertices of the candidate pattern element are overlapped, the candidate pattern element is specified as a key pattern element if remaining vertices of the selected fixed pattern element are positioned on the candidate pattern element. With this operation, a writing pattern element which has a plurality of vertices identical to a plurality of feature vertices of a selected fixed pattern element and can include the selected fixed pattern element can be appropriately specified as a key pattern element out of a plurality of writing pattern elements, even if the writing pattern element has a shape different from that of the selected fixed pattern element, and it is thereby possible to perform high-level extraction of a fixed pattern from a writing pattern.

Figure 27:
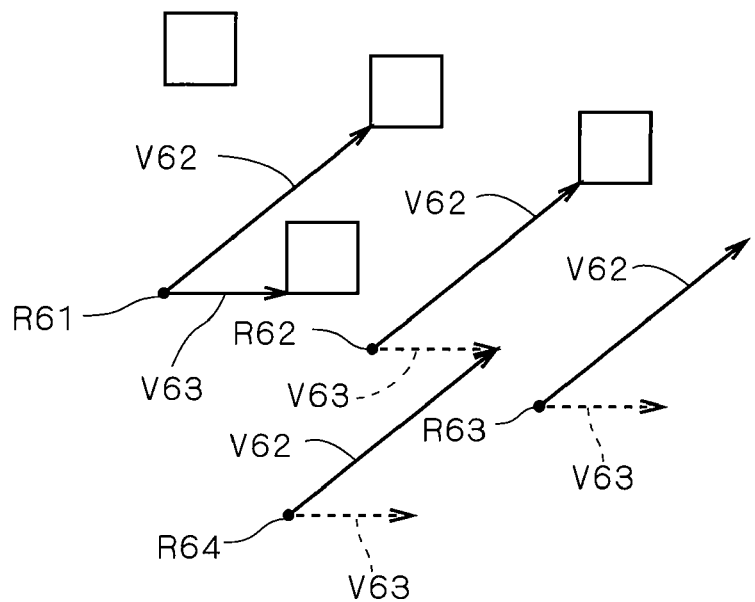
FIG. 27 is a view showing a writing pattern.
Figure 28:
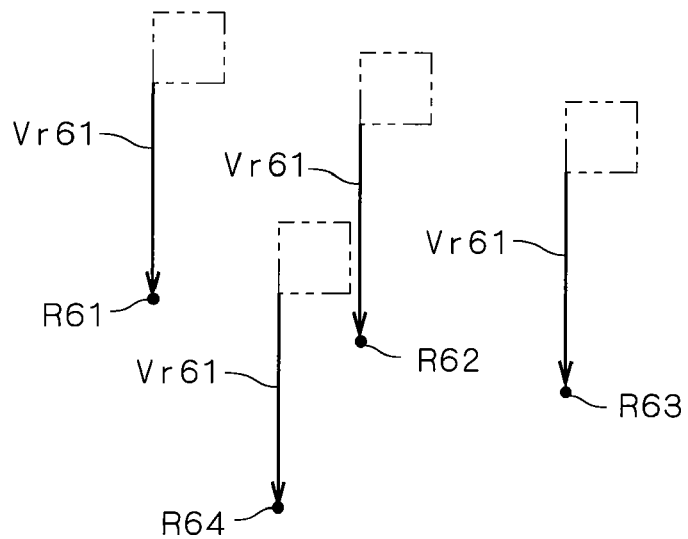
FIG. 28 is a view showing a setting area.

Even in a case where a fixed pattern 76 of FIG. 26 is prepared, if the frequently-used shape B1 of FIG. 23 is prepared as a shape indicating a frequently-used pattern element, all the fixed pattern elements included in the fixed pattern 76 have the frequently-used shape. In this case, in the pattern element specifying part 51, one fixed pattern element is forcedly selected as a selected fixed pattern element. In a case, for example, where a writing pattern 66 of FIG. 27 is inputted, if one fixed pattern element represented by reference sign 761 in FIG. 26 is selected as a selected fixed pattern element, in the pattern element specifying part 51, each of writing pattern elements in the writing pattern 66 is specified as a key pattern element corresponding to the selected fixed pattern element 761 and in a setting area for the fixed pattern 76 shown in FIG. 28, a value of "1" is given to positions R61, R62, R63 and R64 designated by a reverse vector Vr61 of a position vector V61 of the fixed pattern element 761 with each of the writing pattern elements as a starting point and these positions R61 to R64 are determined as candidate existing positions for the fixed pattern 76. In this case, position information of frequently-used pattern element indicating a position of each writing pattern element in the writing pattern 66 which coincides with the fixed shape of the selected fixed pattern element 761 is also generated.

Then, in a case where the position information of frequently-used pattern element includes positions in the writing pattern 66 which are designated by position vectors V62 and V63 of the fixed pattern elements other than the selected fixed pattern element which are included in the fixed pattern 76 with each of the candidate existing positions R61 to R64 as a starting point, this candidate existing position is detected as final existing position of the fixed pattern 76. Actually, the candidate existing position R61 is detected as the final existing position of the fixed pattern 76. With this operation, even if all the fixed pattern elements included in the fixed pattern 76 have the same shape (the frequently-used shape) as the frequently-used pattern element, it is possible to achieve quick extraction of the fixed pattern 76 from the writing pattern 66. Since the positions designated by the position vector V62 with the candidate existing positions R62 to R64 as starting points are not included in the position information of frequently-used pattern element, no calculation is performed for positions designated by the position vector V63 with these candidate existing positions R62 to R64 as starting points (indicated by broken-line arrows in FIG. 27).

Though the preferred embodiments of the present invention have been discussed above, the present invention is not limited to the above-discussed preferred embodiments, but allows various variations.

In the above preferred embodiments, the function as a memory for storing the fixed pattern information (and the shape information of frequently-used pattern element) is not necessarily implemented by the fixed disk 44 but may be implemented by the RAM 43 or the like.

The fixed pattern information does not always need to definitely indicate a shape of each fixed pattern element and a position vector of each fixed pattern element in a fixed pattern but may be any information only if it gives a shape and a position vector of each fixed pattern element (for example, information represented as vector data or the like). In a case where a plurality of fixed patterns are prepared, if a plurality of fixed pattern elements are arranged in at least one fixed pattern, the plurality of fixed patterns may include a fix pattern including only one fixed pattern element.

In the first and second preferred embodiments, a position coincident with the number of fixed pattern elements included in a fixed pattern is detected as an existing position (or a candidate existing position) of the fixed pattern since the accumulator 52 adds a value of "1" to the position in each setting area designated on the basis of a key pattern element, but in a case where the accumulator 52 adds a value other than "1" in the setting area, a position in the setting area which has the same value as the product of the number of fixed pattern elements included in the fixed pattern and their values is detected as an existing position of the fixed pattern. In other words, in the position detecting part 53 (or the first position detecting part 53a), by specifying a position in the setting area to which a value corresponding to the number of fixed pattern elements is given, an existing position of the fixed pattern in the writing pattern is detected.

In the above preferred embodiments, the pattern writing apparatus 1 may use a light beam or the like, as well as an electron beam, as an energy beam for writing. In a case where the light beam is used, for example, a light shielding pattern may be formed on a glass substrate, to make an opening pattern in the mask part. In other words, by forming beam passage areas corresponding to a fixed pattern (the areas correspond to fixed pattern elements included in the fixed pattern) in the mask part, it is possible to write the fixed pattern on the substrate 9.

The irradiation position on the substrate 9 to which the electron beam passing the mask part is emitted may be changed by moving the substrate 9 relatively to the head part 2. The substrate 9 on which a pattern is written is not necessarily limited to a semiconductor substrate but may be a printed circuit board, a glass substrate or the like.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2005-120823 filed in the Japan Patent Office on Apr. 19, 2005, the entire disclosure of which is incorporated herein by reference.

What is claimed is:

1. A fixed pattern extracting apparatus for extracting a fixed pattern in which a plurality of fixed pattern elements are arranged from a writing pattern in which a plurality of writing pattern elements are arranged to be written on a substrate, comprising:

a memory for storing fixed pattern information indicating respective shapes of a plurality of fixed pattern elements included in a fixed pattern and respective position vectors of said plurality of fixed pattern elements with respect to a predetermined reference position in said fixed pattern, the starting point of each said respective position vector being said reference position in said fixed pattern, the ending point of each said respective position vector being a reference vertex for its respective fixed pattern element;

a pattern element specifying part for specifying a plurality of key pattern elements coincident with or including any of said plurality of fixed pattern elements from a plurality of writing pattern elements included in a writing pattern with reference to said fixed pattern information;

an accumulator for adding a predetermined value to a position designated by a reverse vector of a position vector of a fixed pattern element corresponding to each of said plurality of key pattern elements with said each of said plurality of key pattern elements as a starting point in an initialized two-dimensional area that is an area which corresponds to said writing pattern and has positions each of which can store a value by being given said value, said fixed pattern element being coincident with or included in said each of said plurality of key pattern elements, said starting point of said reverse vector being a reference vertex in said each of said plurality of key pattern elements, an ending point of said reverse vector corresponding to said reference position in said fixed pattern; and a position detecting part for detecting an existing position of said fixed pattern in said writing pattern by specifying a position to which a value is given, which corresponds to the number of said plurality of fixed pattern elements in said two-dimensional area after additions of values for all said plurality of key pattern elements are completed by said accumulator; wherein a plurality of feature vertices are determined in advance for each of said plurality of fixed pattern elements, which exist along a polygonal-line contour of said each of said plurality of fixed pattern elements;

said pattern element specifying part specifies a candidate pattern element out of said plurality of writing pattern elements, which has a plurality of candidate vertices which have the same relative two-dimensional positional relation with respect to a first point as said plurality of feature vertices for a first fixed pattern element included in said plurality of fixed pattern elements have with respect to the reference vertex for said first fixed pattern element and exist along a polygonal-line contour of said candidate pattern element and said pattern element specifying part further specifies said candidate pattern element as a key pattern element if remaining vertices, which are vertices other than said plurality of feature vertices, of said first fixed pattern element each have a two-dimensional positional offset with respect to the reference vertex for said first fixed pattern element which when used as an offset from the first point would be inside or on the contour of said candidate pattern element; and said fixed pattern whose existing position is detected, is a pattern to be written on a substrate by using a mask part which has a pattern having the same shape as said fixed pattern.

2. The fixed pattern extracting apparatus according to claim 1, wherein
a plurality of fixed patterns are prepared, and
said accumulator sets said two-dimensional area individually for each of said plurality of fixed patterns.

3. The fixed pattern extracting apparatus according to claim 2, wherein
an evaluation value obtained by subtracting the number of writing operations for writing one fixed pattern from a division number by which said one fixed pattern is divided into rectangle pattern elements is compared with an evaluation value obtained by subtracting the number of writing operations for writing another fixed pattern from a division number by which said another fixed pattern is divided into rectangle pattern elements and only either of said one fixed pattern and said another fixed pattern, whichever has a larger evaluation value, is extracted from said writing pattern if at least part of an existing area of said one fixed pattern in said writing pattern overlaps at least part of an existing area of said another fixed pattern.

4. A fixed pattern extracting apparatus for extracting a fixed pattern in which a plurality of fixed pattern elements are arranged from a writing pattern in which a plurality of writing pattern elements are arranged to be written on a substrate, comprising:
a memory for storing fixed pattern information indicating respective shapes of a plurality of fixed pattern elements included in a fixed pattern and respective position vectors of said plurality of fixed pattern elements with respect to a predetermined reference position in said fixed pattern and shape information of frequently-used pattern element which indicates a frequently-used shape of predetermined frequently-used pattern elements, each of which has said frequently-used shape, included in a plurality of writing pattern elements in a writing pattern, the starting point of each said respective position vector being said reference position in said fixed pattern, the ending point of each said respective position vector being a reference vertex for its respective fixed pattern element;
a pattern element specifying part for specifying at least one key pattern element, from said plurality of writing pattern elements, coincident with or including any of at least one selected fixed pattern element other than at least one pattern element having said frequently-used shape among said plurality of fixed pattern elements with reference to said fixed pattern information and said shape information of frequently-used pattern element;
a position information generator for generating position information of frequently-used pattern element which indicates the positions of said frequently-used pattern elements in said writing pattern, which is specified from said plurality of writing pattern elements;
an accumulator for adding a predetermined value to a position designated by a reverse vector of a position vector of a fixed pattern element corresponding to each of said at least one key pattern element with said each of said at least one key pattern element as a starting point in an initialized two-dimensional area that is an area which corresponds to said writing pattern and has positions each of which can store a value by being given said value, said fixed pattern element being coincident with or included in said each of said at least one key pattern element, said starting point of said reverse vector being a reference vertex in said each of said at least one key pattern element, an ending point of said reverse vector corresponding to said reference position in said fixed pattern;
a first position detecting part for detecting a candidate existing position of said fixed pattern in said writing pattern by specifying a position to which a value is given, which corresponds to the number of said at least one selected fixed pattern element in said two-dimensional area after additions of values for all said at least one key pattern element are completed by said accumulator; and
a second position detecting part for detecting said candidate existing position as a final existing position of said fixed pattern if it is confirmed on the basis of said position information of frequently-used pattern element that when said fixed pattern is arranged at said candidate existing position in said writing pattern, any of said frequently-used pattern elements included in said writing pattern exists at a position of each of said at least one pattern element which is included in said fixed pattern and each has said frequently-used shape; wherein
a plurality of feature vertices are determined in advance for each of said at least one selected fixed pattern element, which exist along a polygonal-line contour of said each of said at least one selected fixed pattern element;
said pattern element specifying part specifies a candidate pattern element out of said plurality of writing pattern elements, which has a plurality of candidate vertices which have the same relative two-dimensional positional relation with respect to a first point as said plurality of feature vertices for a first selected fixed pattern element included in said at least one selected fixed pattern element have with respect to the reference vertex for said first selected fixed pattern element and exist along a polygonal-line contour of said candidate pattern element and said pattern element specifying part further specifies said candidate pattern element as a key pattern element if remaining vertices, which are vertices other than said plurality of feature vertices, of said first selected fixed pattern element each have a two-dimensional positional offset with respect to the reference vertex for said first selected fixed pattern element which when used as an offset from the first point would be inside or on the contour of said candidate pattern element; and said fixed pattern whose existing position is detected, is a pattern to be written on a substrate by using a mask part which has a pattern having the same shape as said fixed pattern.

5. The fixed pattern extracting apparatus according to claim 4, wherein
said pattern element specifying part selects one fixed pattern element as said at least one selected fixed pattern element if all said plurality of fixed pattern elements included in said fixed pattern have said frequently-used shape.

6. The fixed pattern extracting apparatus according to claim 4, wherein
a plurality of fixed patterns are prepared, and
said accumulator sets said two-dimensional area individually for each of said plurality of fixed patterns.

7. The fixed pattern extracting apparatus according to claim 6, wherein
an evaluation value obtained by subtracting the number of writing operations for writing one fixed pattern from a division number by which said one fixed pattern is divided into rectangle pattern elements is compared with an evaluation value obtained by subtracting the number of writing operations for writing another fixed pattern from a division number by which said another fixed pattern is divided into rectangle pattern elements and only either of said one fixed pattern and said another fixed pattern, whichever has a larger evaluation value, is extracted from said writing pattern if at least part of an existing area of said one fixed pattern in said writing pattern overlaps at least part of an existing area of said another fixed pattern.

8. A pattern writing apparatus for writing a pattern on a substrate, comprising:
a fixed pattern extracting apparatus for extracting a fixed pattern in which a plurality of fixed pattern elements are arranged from a writing pattern in which a plurality of writing pattern elements are arranged to be written on a substrate;
a stage for holding a substrate;
a beam emission part for emitting an energy beam for writing to a substrate;
a mask part having beam passage areas corresponding to said fixed pattern, being arranged on a path for said energy beam from said beam emission part to a substrate on said stage; and
an irradiation position changing part for changing an irradiation position of said energy beam which passes said mask part, to an existing position of said fixed pattern detected by said fixed pattern extracting apparatus,
wherein said fixed pattern extracting apparatus comprises
a memory for storing fixed pattern information indicating respective shapes of said plurality of fixed pattern elements included in said fixed pattern and respective position vectors of said plurality of fixed pattern elements with respect to a predetermined reference position in said fixed pattern, the starting point of each said respective position vector being said reference position in said fixed pattern, the ending point of each said respective position vector being a reference vertex for its respective fixed pattern element;
a pattern element specifying part for specifying a plurality of key pattern elements coincident with or including any of said plurality of fixed pattern elements from said plurality of writing pattern elements included in said writing pattern with reference to said fixed pattern information;
an accumulator for adding a predetermined value to a position designated by a reverse vector of a position vector of a fixed pattern element corresponding to each of said plurality of key pattern elements with said each of said plurality of key pattern elements as a starting point in an initialized two-dimensional area that is an area which corresponds to said writing pattern and has positions each of which can store a value by being given said value, said fixed pattern element being coincident with or included in said each of said plurality of key pattern elements, said starting point of said reverse vector being a reference vertex in said each of said plurality of key pattern elements, an ending point of said reverse vector corresponding to said reference position in said fixed pattern; and
a position detecting part for detecting said existing position of said fixed pattern in said writing pattern by specifying a position to which a value is given, which corresponds to the number of said plurality of fixed pattern elements in said two-dimensional area after additions of values for all said plurality of key pattern elements are completed by said accumulator;
a plurality of feature vertices are determined in advance for each of said plurality of fixed pattern elements, which exist along a polygonal-line contour of said each of said plurality of fixed pattern elements;
said pattern element specifying part specifies a candidate pattern element out of said plurality of writing pattern elements, which has a plurality of candidate vertices which have the same relative two-dimensional positional relation with respect to a first point as said plurality of feature vertices for a first fixed pattern element included in said plurality of fixed pattern elements have with respect to the reference vertex for said first fixed pattern element and exist along its polygonal-line contour of said candidate pattern element and said pattern element specifying part further specifies said candidate pattern element as a key pattern element if remaining vertices, which are vertices other than said plurality of feature vertices, of said first fixed pattern element each have a two-dimensional positional offset with respect to the reference vertex for said first fixed pattern element which when used as an offset from the first point would be inside or on the contour of said candidate pattern element; and
said fixed pattern whose existing position is detected, is a pattern to be written on a substrate by using said mask part which has a pattern having the same shape as said fixed pattern.

9. A pattern writing apparatus for writing a pattern on a substrate, comprising:
a fixed pattern extracting apparatus for extracting a fixed pattern in which a plurality of fixed pattern elements are arranged from a writing pattern in which a plurality of writing pattern elements are arranged to be written on a substrate;
a stage for holding a substrate;
a beam emission part for emitting an energy beam for writing to a substrate;
a mask part having beam passage areas corresponding to said fixed pattern, being arranged on a path for said energy beam from said beam emission part to a substrate on said stage; and
an irradiation position changing part for changing an irradiation position of said energy beam which passes said mask part, to an existing position of said fixed pattern detected by said fixed pattern extracting apparatus, wherein said fixed pattern extracting apparatus comprises
- a memory for storing fixed pattern information indicating respective shapes of said plurality of fixed pattern elements included in said fixed pattern and respective position vectors of said plurality of fixed pattern elements with respect to a predetermined reference position in said fixed pattern and shape information of frequently-used pattern element which indicates a frequently-used shape of predetermined frequently-used pattern elements, each of which has said frequently-used shape, included in said plurality of writing pattern elements in said writing pattern, the starting point of each said respective position vector being said reference position in said fixed pattern, the ending point of each said respective position vector being a reference vertex for its respective fixed pattern element;
- a pattern element specifying part for specifying at least one key pattern element, from said plurality of writing pattern elements, coincident with or including any of at least one selected fixed pattern element other than at least one pattern element having said frequently-used shape among said plurality of fixed pattern elements with reference to said fixed pattern information and said shape information of frequently-used pattern element;
- a position information generator for generating position information of frequently-used pattern element which indicates the positions of said frequently-used pattern elements in said writing pattern, which is specified from said plurality of writing pattern elements;
- an accumulator for adding a predetermined value to a position designated by a reverse vector of a position vector of a fixed pattern element corresponding to each of said at least one key pattern element with said each of said at least one key pattern element as a starting point in an initialized two-dimensional area that is an area which corresponds to said writing pattern and has positions each of which can store a value by being given said value, said fixed pattern element being coincident with or included in said each of said at least one key pattern element, said starting point of said reverse vector being a reference vertex in said each of said at least one key pattern element, an ending point of said reverse vector corresponding to said reference position in said fixed pattern;
- a first position detecting part for detecting a candidate existing position of said fixed pattern in said writing pattern by specifying a position to which a value is given, which corresponds to the number of said at least one selected fixed pattern element in said two-dimensional area after additions of values for all said at least one key pattern element are completed by said accumulator; and
- a second position detecting part for detecting said candidate existing position as a final existing position of said fixed pattern if it is confirmed on the basis of said position information of frequently-used pattern element that when said fixed pattern is arranged at said candidate existing position in said writing pattern, any of said frequently-used pattern elements included in said writing pattern exists at a position of each of said at least one pattern element which is included in said fixed pattern and each has said frequently-used shape; and
- a plurality of feature vertices are determined in advance for each of said at least one selected fixed pattern element, which exist along a polygonal-line contour of said each of said at least one selected fixed pattern element;
- said pattern element specifying part specifies a candidate pattern element out of said plurality of writing pattern elements, which has a plurality of candidate vertices which have the same relative two-dimensional positional relation with respect to a first point as said plurality of feature vertices for a first selected fixed pattern element included in said at least one selected fixed pattern element have with respect to the reference vertex for said first selected fixed pattern element and exist along a polygonal-line contour of said candidate pattern element and said pattern element specifying part further specifies said candidate pattern element as a key pattern element if remaining vertices, which are vertices other than said plurality of feature vertices, of said first selected fixed pattern element each have a two-dimensional positional offset with respect to the reference vertex for said first selected fixed pattern element which when used as an offset from the first point would be inside or on the contour of said candidate pattern element; and
- said fixed pattern whose existing position is detected, is a pattern to be written on a substrate by using said mask part which has a pattern having the same shape as said fixed pattern.

10. A fixed pattern extracting method for extracting a fixed pattern in which a plurality of fixed pattern elements are arranged from a writing pattern in which a plurality of writing pattern elements are arranged to be written on a substrate, comprising the steps of:
- a) preparing fixed pattern information indicating respective shapes of a plurality of fixed pattern elements included in a fixed pattern and respective position vectors of said plurality of fixed pattern elements with respect to a predetermined reference position in said fixed pattern, the starting point of each said respective position vector being said reference position in said fixed pattern, the ending point of each said respective position vector being a reference vertex for its respective fixed pattern element;
- b) specifying a plurality of key pattern elements coincident with or including any of said plurality of fixed pattern elements from a plurality of writing pattern elements included in a writing pattern with reference to said fixed pattern information;
- c) adding a predetermined value to a position designated by a reverse vector of a position vector of a fixed pattern element corresponding to each of said plurality of key pattern elements with said each of said plurality of key pattern elements as a starting point in an initialized two-dimensional area that is an area which corresponds to said writing pattern and has positions each of which can store a value by being given said value, said fixed pattern element being coincident with or included in said each of said plurality of key pattern elements, said starting point of said reverse vector being a reference vertex in said each of said plurality of key pattern elements, an ending point of said reverse vector corresponding to said reference position in said fixed pattern; and
- d) detecting an existing position of said fixed pattern in said writing pattern by specifying a position to which a value is given, which corresponds to the number of said plurality of fixed pattern elements in said two-dimensional area after additions of values for all said plurality of key pattern elements are completed in said step c); wherein
a plurality of feature vertices are determined in advance for each of said plurality of fixed pattern elements, which exist along a polygonal-line contour of said each of said plurality of fixed pattern elements;

in said step b), a candidate pattern element out of said plurality of writing pattern elements, which has a plurality of candidate vertices which have the same relative two-dimensional positional relation with respect to a first point as said plurality of feature vertices for a first fixed pattern element included in said plurality of fixed pattern elements have with respect to the reference vertex for said first fixed pattern element and exist along a polygonal-line contour of said candidate pattern element is specified and said candidate pattern element is further specified as a key pattern element if remaining vertices, which are vertices other than said plurality of feature vertices, of said first fixed pattern element each have a two-dimensional positional offset with respect to the reference vertex for said first fixed pattern element which when used as an offset from the first point would be inside or on the contour of said candidate pattern element;

said fixed pattern whose existing position is detected, is a pattern to be written on a substrate by using a mask part which has a pattern having the same shape as said fixed pattern; and the above steps are performed by using a computer.

11. A fixed pattern extracting method for extracting a fixed pattern in which a plurality of fixed pattern elements are arranged from a writing pattern in which a plurality of writing pattern elements are arranged to be written on a substrate, comprising the steps of:

a) preparing fixed pattern information indicating respective shapes of a plurality of fixed pattern elements included in a fixed pattern and respective position vectors of said plurality of fixed pattern elements with respect to a predetermined reference position in said fixed pattern and shape information of frequently-used pattern element which indicates a frequently-used shape of predetermined frequently-used pattern elements, each of which has said frequently-used shape, included in a plurality of writing pattern elements in a writing pattern, the starting point of each said respective position vector being said reference position in said fixed pattern, the ending point of each said respective position vector being a reference vertex for its respective fixed pattern element;

b) specifying at least one key pattern element, from said plurality of writing pattern elements, coincident with or including any of at least one selected fixed pattern element other than at least one pattern element having said frequently-used shape among said plurality of fixed pattern elements with reference to said fixed pattern information and said shape information of frequently-used pattern element;

c) generating position information of frequently-used pattern element which indicates the positions of said frequently-used pattern elements in said writing pattern, which is specified from said plurality of writing pattern elements;

d) adding a predetermined value to a position designated by a reverse vector of a position vector of a fixed pattern element corresponding to each of said at least one key pattern element with said each of said at least one key pattern element as a starting point in an initialized two-dimensional area that is an area which corresponds to said writing pattern and has positions each of which can store a value by being given said value, said fixed pattern element being coincident with or included in said each of said at least one key pattern element, said starting point of said reverse vector being a reference vertex in said each of said at least one key pattern element, an ending point of said reverse vector corresponding to said reference position in said fixed pattern;

e) detecting a candidate existing position of said fixed pattern in said writing pattern by specifying a position to which a value is given, which corresponds to the number of said at least one selected fixed pattern element in said two-dimensional area after additions of values for all said at least one key pattern element are completed in said step d); and f) detecting said candidate existing position as a final existing position of said fixed pattern if it is confirmed on the basis of said position information of frequently-used pattern element that when said fixed pattern is arranged at said candidate existing position in said writing pattern, any of said frequently-used pattern elements included in said writing pattern exists at a position of each of said at least one pattern element which is included in said fixed pattern and each has said frequently-used shape; wherein a plurality of feature vertices are determined in advance for each of said at least one selected fixed pattern element, which exist along a polygonal-line contour of said each of said at least one selected fixed pattern element;

in said step b), a candidate pattern element out of said plurality of writing pattern elements, which has a plurality of candidate vertices which have the same relative two-dimensional positional relation with respect to a first point as said plurality of feature vertices for a first selected fixed pattern element included in said at least one selected fixed pattern element have with respect to the reference vertex for said first selected fixed pattern element and exist along a polygonal-line contour of said candidate pattern element is specified and said candidate pattern element is further specified as a key pattern element if remaining vertices, which are vertices other than said plurality of feature vertices, of said first selected fixed pattern element each have a two-dimensional positional offset with respect to the reference vertex for said first selected fixed pattern element which when used as an offset from the first point would be inside or on the contour of said candidate pattern element;

said fixed pattern whose existing position is detected, is a pattern to be written on a substrate by using a mask part which has a pattern having the same shape as said fixed pattern; and the above steps are performed by using a computer.

12. A computer-readable recording medium carrying a program for causing a computer to extract a fixed pattern in which a plurality of fixed pattern elements are arranged from a writing pattern in which a plurality of writing pattern elements are arranged to be written on a substrate, wherein execution of said program by a computer causes said computer to perform the steps of:

a) preparing fixed pattern information indicating respective shapes of a plurality of fixed pattern elements included in a fixed pattern and respective position vectors of said plurality of fixed pattern elements with respect to a predetermined reference position in said fixed pattern, the starting point of each said respective position vector being said reference position in said fixed pattern, the ending point of each said respective position vector being a reference vertex for its respective fixed pattern element;

b) specifying a plurality of key pattern elements coincident with or including any of said plurality of fixed pattern elements from a plurality of writing pattern elements included in a writing pattern with reference to said fixed pattern information;

c) adding a predetermined value to a position designated by a reverse vector of a position vector of a fixed pattern element corresponding to each of said plurality of key pattern elements with said each of said plurality of key pattern elements as a starting point in an initialized two-dimensional area that is an area which corresponds to said writing pattern and has positions each of which can store a value by being given said value, said fixed pattern element being coincident with or included in said each of said plurality of key pattern elements, said starting point of said reverse vector being a reference vertex in said each of said plurality of key pattern elements, an ending point of said reverse vector corresponding to said reference position in said fixed pattern; and d) detecting an existing position of said fixed pattern in said writing pattern by specifying a position to which a value is given, which corresponds to the number of said plurality of fixed pattern elements in said two-dimensional area after additions of values for all said plurality of key pattern elements are completed in said step c); wherein a plurality of feature vertices are determined in advance for each of said plurality of fixed pattern elements, which exist along a polygonal-line contour of said each of said plurality of fixed pattern elements;

in said step b), a candidate pattern element out of said plurality of writing pattern elements, which has a plurality of candidate vertices which have the same relative two-dimensional positional relation with respect to a first point as said plurality of feature vertices for a first fixed pattern element included in said plurality of fixed pattern elements have with respect to the reference vertex for said first fixed pattern element and exist along a polygonal-line contour of said candidate pattern element is specified and said candidate pattern element is further specified as a key pattern element if remaining vertices, which are vertices other than said plurality of feature vertices, of said first fixed pattern element each have a two-dimensional positional offset with respect to the reference vertex for said first fixed pattern element which when used as an offset from the first point would be inside or on the contour of said candidate pattern element; and said fixed pattern whose existing position is detected, is a pattern to be written on a substrate by using a mask part which has a pattern having the same shape as said fixed pattern.

13. A computer-readable recording medium carrying a program for causing a computer to extract a fixed pattern in which a plurality of fixed pattern elements are arranged from a writing pattern in which a plurality of writing pattern elements are arranged to be written on a substrate, wherein execution of said program by a computer causes said computer to perform the steps of:

a) preparing fixed pattern information indicating respective shapes of a plurality of fixed pattern elements included in a fixed pattern and respective position vectors of said plurality of fixed pattern elements with respect to a predetermined reference position in said fixed pattern and shape information of frequently-used pattern element which indicates a frequently-used shape of predetermined frequently-used pattern elements, each of which has said frequently-used shape, included in a plurality of writing pattern elements in a writing pattern, the starting point of each said respective position vector being said reference position in said fixed pattern, the ending point of each said respective position vector being a reference vertex for its respective fixed pattern element;

b) specifying at least one key pattern element, from said plurality of writing pattern elements, coincident with or including any of at least one selected fixed pattern element other than at least one pattern element having said frequently-used shape among said plurality of fixed pattern elements with reference to said fixed pattern information and said shape information of frequently-used pattern element;

c) generating position information of frequently-used pattern element which indicates the positions of said frequently-used pattern elements in said writing pattern, which is specified from said plurality of writing pattern elements;

d) adding a predetermined value to a position designated by a reverse vector of a position vector of a fixed pattern element corresponding to each of said at least one key pattern element with said each of said at least one key pattern element as a starting point in an initialized two-dimensional area that is an area which corresponds to said writing pattern and has positions each of which can store a value by being given said value, said fixed pattern element being coincident with or included in said each of said at least one key pattern element, said starting point of said reverse vector being a reference vertex in said each of said at least one key pattern element, an ending point of said reverse vector corresponding to said reference position in said fixed pattern;

e) detecting a candidate existing position of said fixed pattern in said writing pattern by specifying a position to which a value is given, which corresponds to the number of said at least one selected fixed pattern element in said two-dimensional area after additions of values for all said at least one key pattern element are completed in said step d); and f) detecting said candidate existing position as a final existing position of said fixed pattern if it is confirmed on the basis of said position information of frequently-used pattern element that when said fixed pattern is arranged at said candidate existing position in said writing pattern, any of said frequently-used pattern elements included in said writing pattern exists at a position of each of said at least on pattern element which is included in said fixed pattern and each has said frequently-used shape; wherein a plurality of feature vertices are determined in advance for each of said at least one selected fixed pattern element, which exist along a polygonal-line contour of said each of said at least one selected fixed pattern element;

in said step b), a candidate pattern element out of said plurality of writing pattern elements, which has a plurality of candidate vertices which have the same relative two-dimensional positional relation with respect to a first point as said plurality of feature vertices for a first selected fixed pattern element included in said at least one selected fixed pattern element have with respect to the reference vertex for said first selected fixed pattern element and exist along a polygonal-line contour of said candidate pattern element is specified and said candidate pattern element is further specified as a key pattern element if remaining vertices, which are vertices other than said plurality of feature vertices, of said first selected fixed pattern element each have a two-dimensional positional offset with respect to the reference vertex for said first selected fixed pattern element which when used as an offset from the first point would be inside or on the contour of said candidate pattern element; and said fixed pattern whose existing position is detected, is a pattern to be written on a substrate by using a mask part which has a pattern having the same shape as said fixed pattern.

* * * * *